United States Patent [19]
Kido

[11] Patent Number: 5,869,199
[45] Date of Patent: Feb. 9, 1999

[54] ORGANIC ELECTROLUMINESCENT ELEMENTS COMPRISING TRIAZOLES

[75] Inventor: Junji Kido, Yonezawa, Japan

[73] Assignee: Sumitomo Electric Industries, Ltd., Osaka, Japan

[21] Appl. No.: 343,494

[22] PCT Filed: Mar. 17, 1994

[86] PCT No.: PCT/JP94/00435

§ 371 Date: Jan. 11, 1995

§ 102(e) Date: Jan. 11, 1995

[87] PCT Pub. No.: WO94/22974

PCT Pub. Date: Oct. 13, 1994

[30] Foreign Application Priority Data

| Mar. 26, 1993 | [JP] | Japan | 5-68783 |
| May 25, 1993 | [JP] | Japan | 5-122927 |
| Jun. 18, 1993 | [JP] | Japan | 5-147849 |
| Jul. 28, 1993 | [JP] | Japan | 5-186223 |
| Jul. 28, 1993 | [JP] | Japan | 5-186224 |

[51] Int. Cl.$^6$ .................................................. H05B 33/12
[52] U.S. Cl. .................... 428/690; 428/704; 428/917; 428/411.1; 428/457; 313/502; 313/504; 313/506
[58] Field of Search ............... 428/411.1, 457, 428/461, 690, 704, 917; 313/502, 504, 506

[56] References Cited

U.S. PATENT DOCUMENTS

| 3,112,197 | 11/1963 | Neugebauer et al. | |
| 5,093,210 | 3/1992 | Ohta et al. | 428/690 |
| 5,130,603 | 7/1992 | Tokailin et al. | 313/504 |
| 5,150,006 | 9/1992 | Van Slyke et al. | 313/504 |
| 5,256,945 | 10/1993 | Imai et al. | 313/504 |
| 5,405,709 | 4/1995 | Littman et al. | 428/690 |

FOREIGN PATENT DOCUMENTS

| 4212286 | 8/1992 | Japan . |
| 4237993 | 8/1992 | Japan . |
| 4-308689 | 10/1992 | Japan . |
| 4298989 | 10/1992 | Japan . |
| 4363894 | 12/1992 | Japan . |
| 1393750 | 5/1975 | United Kingdom . |
| WO92/00515 | 1/1992 | WIPO . |

*Primary Examiner*—Marie R. Yamnitzky
*Attorney, Agent, or Firm*—Beveridge, Degrandi Weilacher & Young, LLP

[57] ABSTRACT

An organic electroluminescent element (device) having different layer structures. The first element is a layer of a lower-molecular 1,2,4-triazole derivative; the second element is a carrier-transport control layer for selectively transporting holes or electrons, which is interposed between an electron-transport layer and a hole-transport layer. The third element is a hole-transport wherein a dye is molecularly dispersed and an electron-transport layer, both being laminated each other. The fourth element is a layer containing a high-molecular 1,2,4-triazole derivative as a hole-transport material; and the fifth element is a hole-transport layer wherein a hole-transport material is molecularly dispersed in a high-molecular 1,2,4-triazole derivative as a resin binder. The organic electroluminescent device is excellent in luminous efficiency, luminance and stability, permitting blue light emission, multi-color light emission (three primary color), and white light.

22 Claims, 19 Drawing Sheets

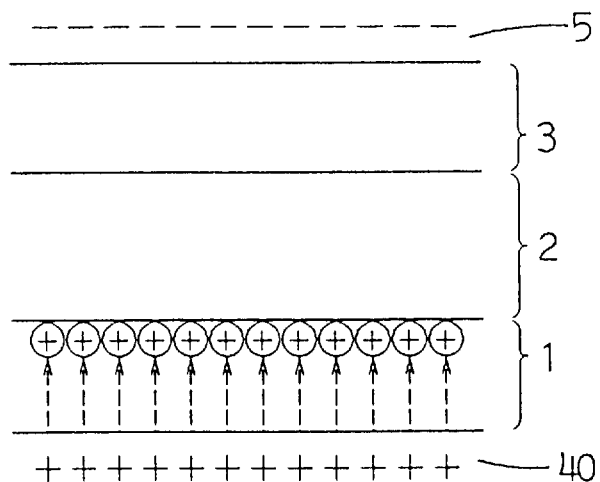
F I G. 2 (a)
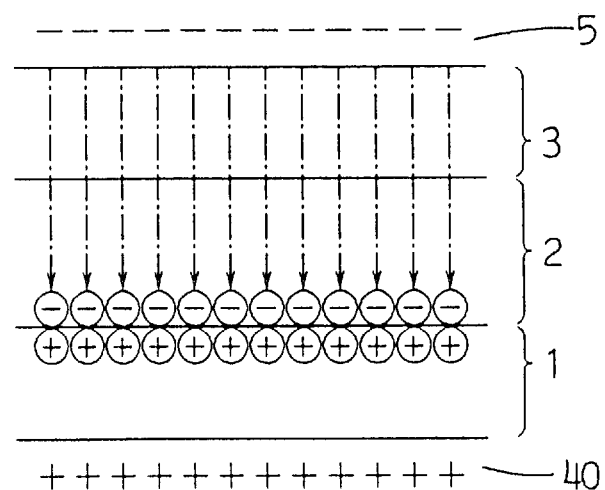
F I G. 2 (b)
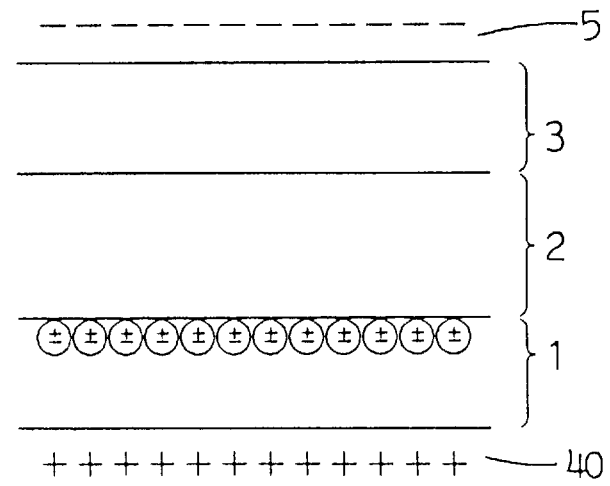
F I G. 2 (c)

F I G. 4 (a)
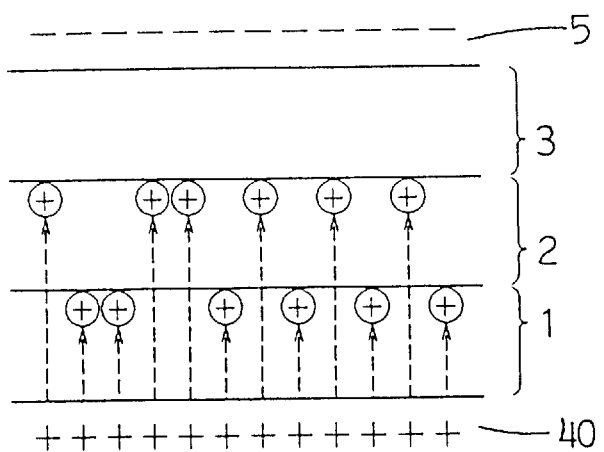
F I G. 4 (b)
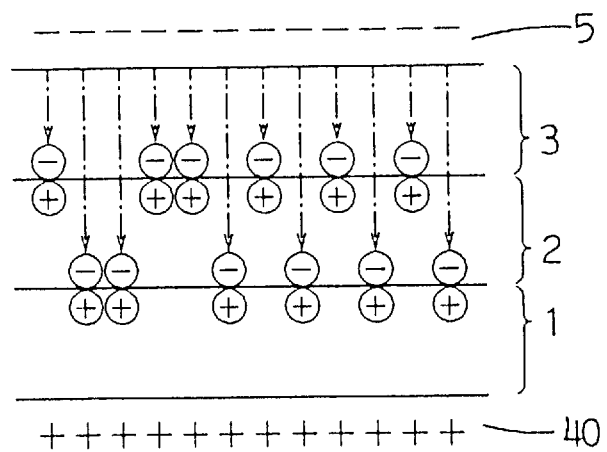
F I G. 4 (c)
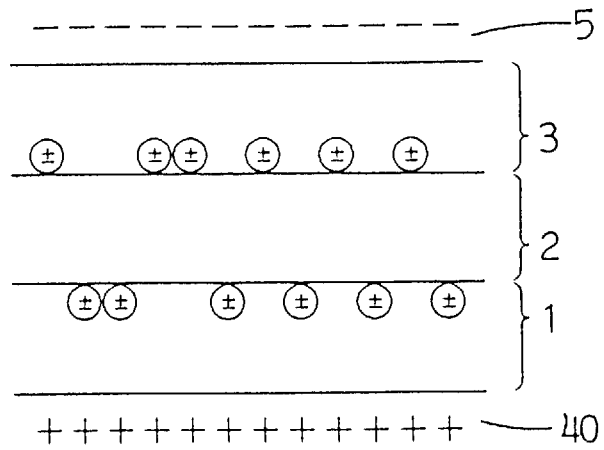

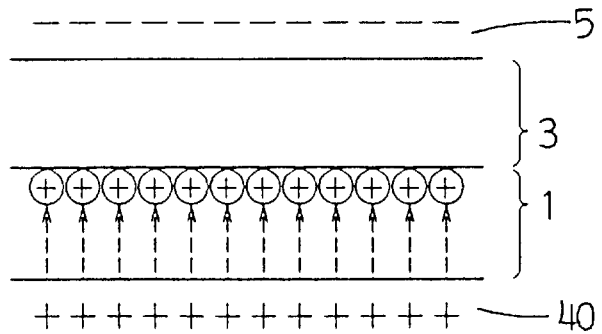
F I G. 5(a)
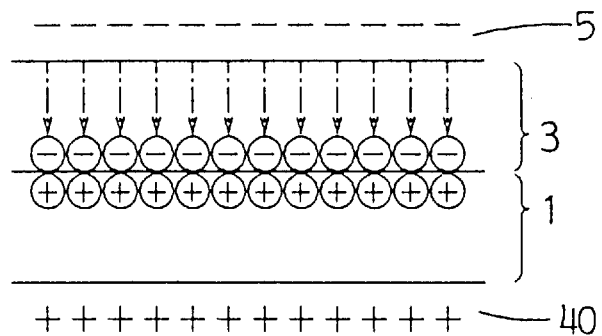
F I G. 5(b)
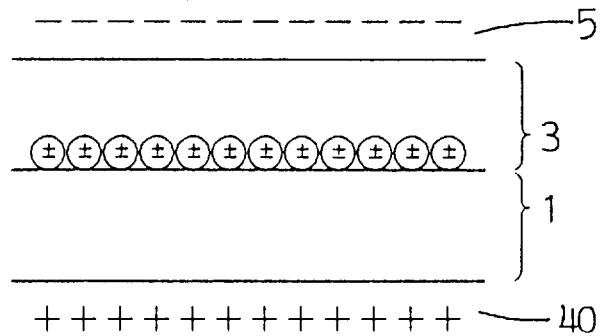
F I G. 5(c)

F I G. 12
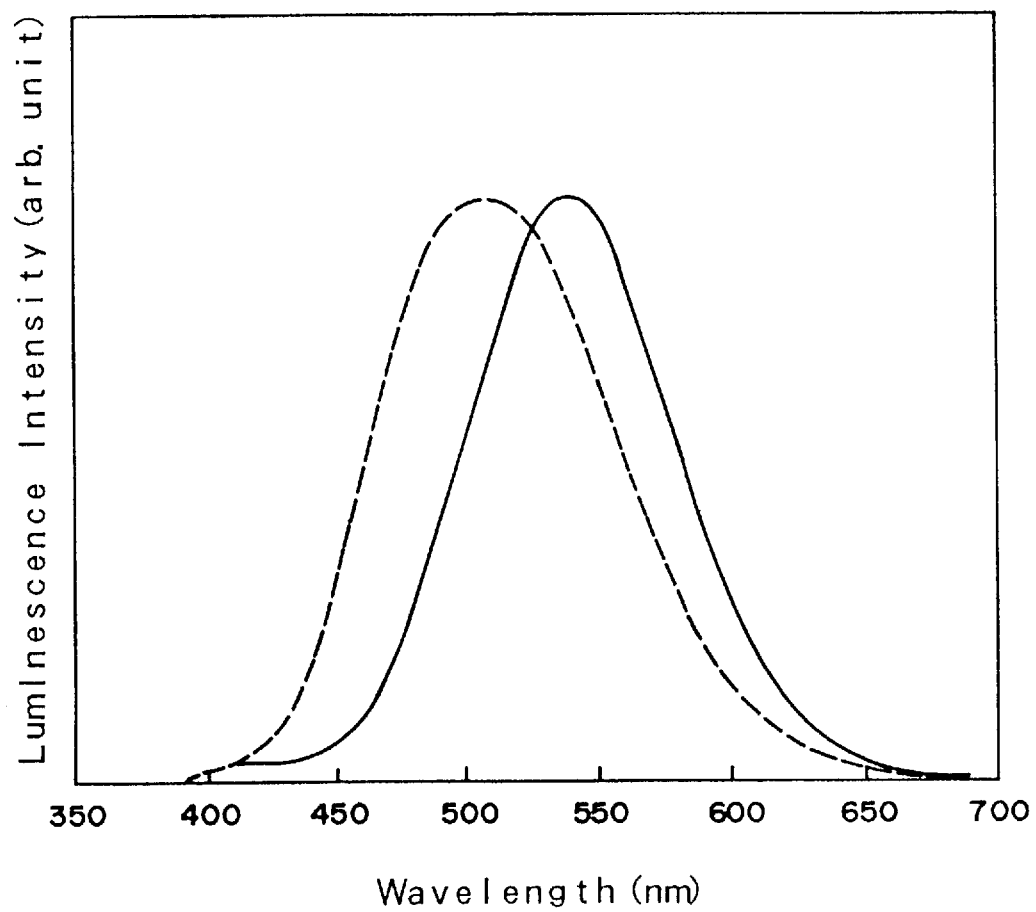

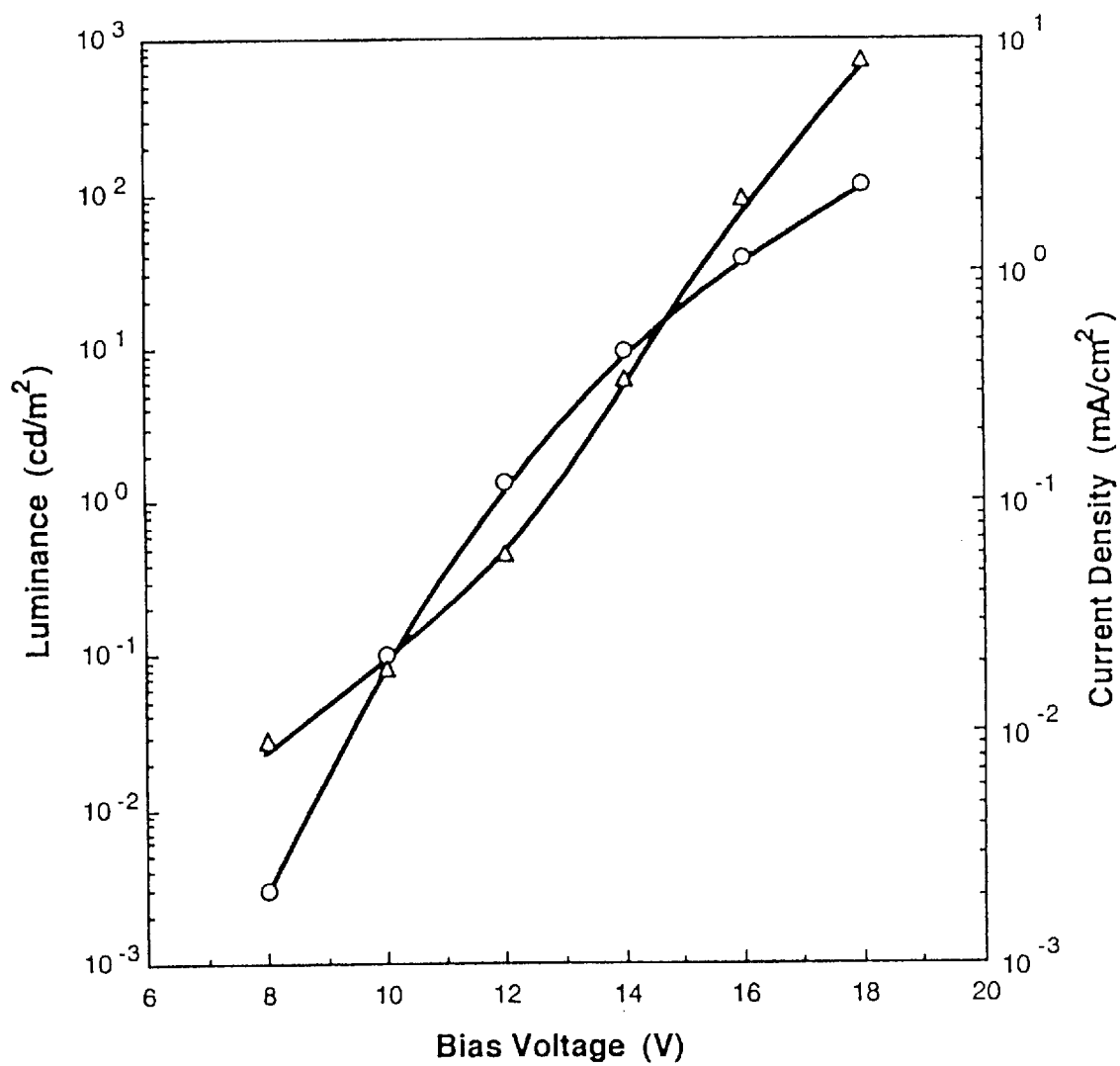
F I G. 17

F I G. 18
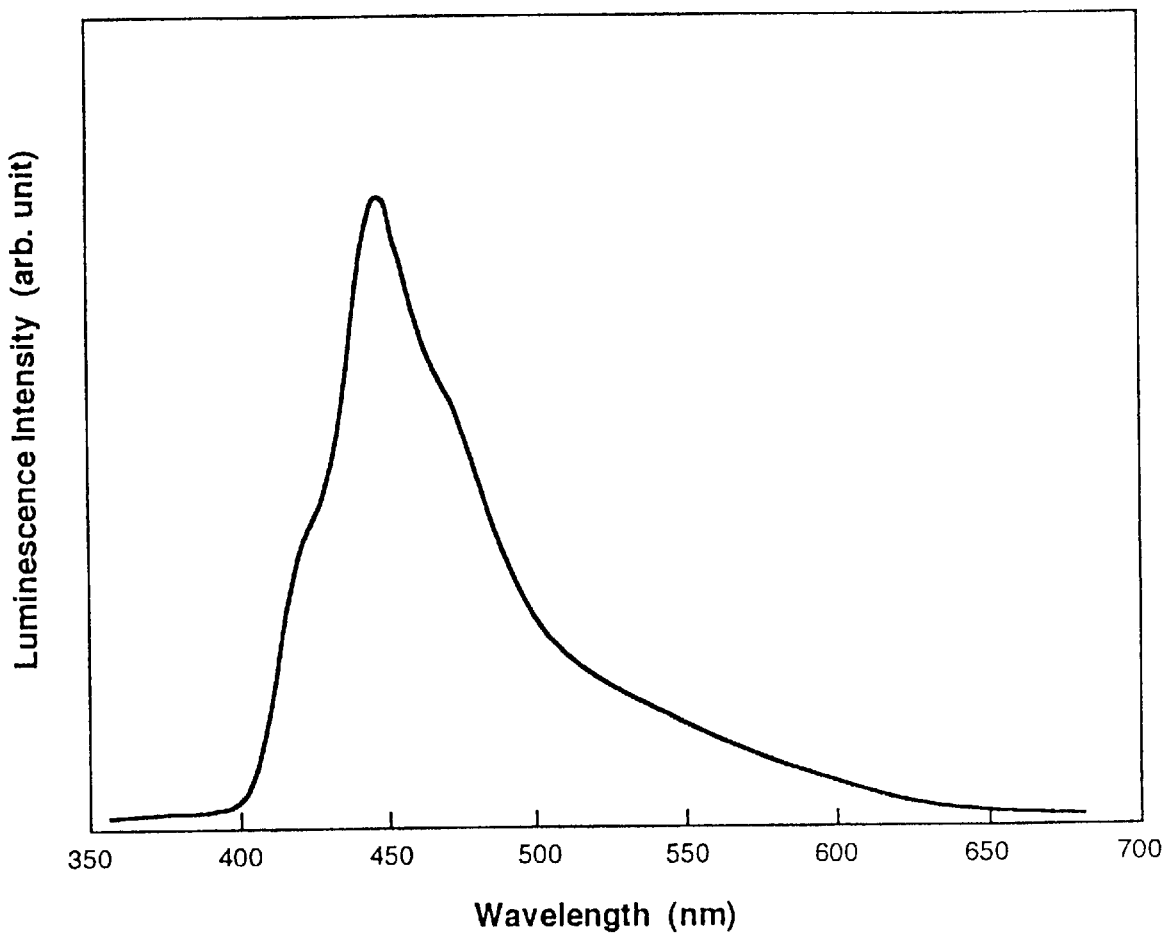

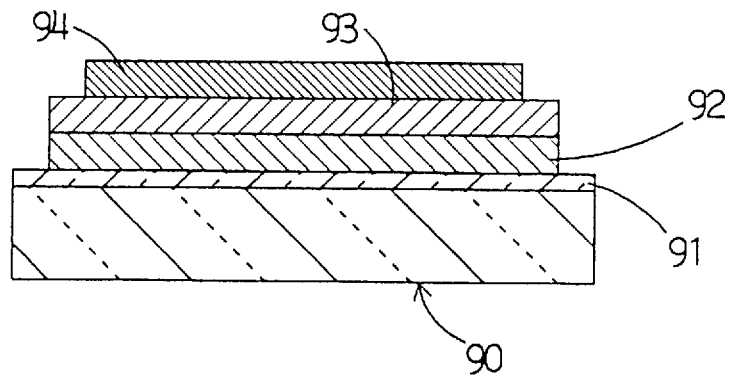
F I G. 19( a )
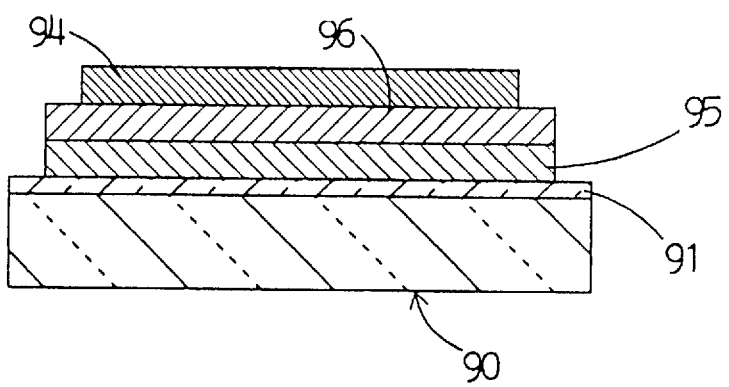
F I G. 19( b )
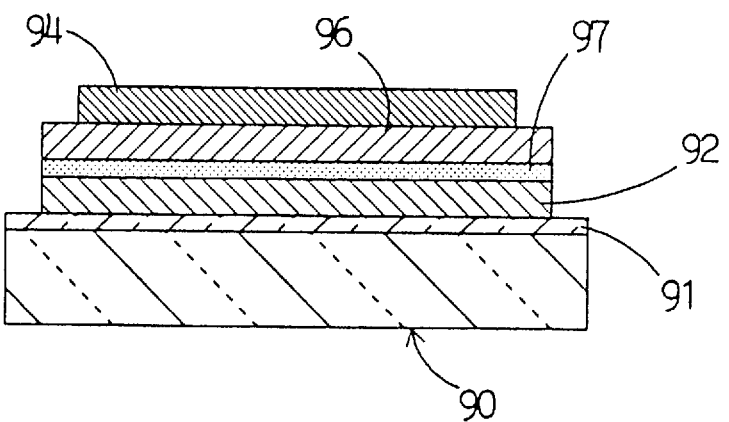
F I G. 19( c )

ORGANIC ELECTROLUMINESCENT ELEMENTS COMPRISING TRIAZOLES

TECHNICAL FIELD

The present invention relates to organic electroluminescent (EL) elements.

BACKGROUND ART

It is considered that the light emission of an organic electroluminescent element is caused by a phenomenon where holes and electrons injected from electrode are recombined within a luminescent layer to generate excitons, and the excitons excite molecules of luminescent materials constituting the luminescent layer. By employing fluorescent dye as a luminescent material, there can obtain an emission spectrum, as an electroluminescence, being equivalent to photoluminescence of the dye molecules.

Tang and Vanslyke recently proposed an element comprising two layers of a hole-transport layer and an electron-transport luminescent layer which efficiently emits green light at a lower voltage of about 10 V compared with a conventional organic electroluminescent element of a single-layer structure [C. W. Tang and S. A. Vanslyke; Appl. Phys. Lett., 51 (1987) 913]. This element's structure is, as shown in FIG. 19(a), composed of an anode 91, a hole-transport layer 92, an electron-transport luminescent layer 93 and a cathode 94, which are formed in this order on a glass substrate 90.

In this element, the hole-transport layer 92 not only allows holes to be injected from the anode 91 into the electron-transport luminescent layer 93, but prevents electrons injected from the cathode 94 from escaping into the anode 91 without recombining with the holes, so that the electrons are contained into the electron-transport luminescent layer 93. Thus, the electron containment effect due to the hole-transport layer 92 facilitates the recombination of the holes and the electrons compared with the conventional single-layer structure element, resulting in a substantial decrease in drive voltage.

Saito et al. showed that not only the electron-transport layer but hole-transport layer can become the luminescent layer in the two-layer structure element [C. Adachi, T. Tsutsui and S. Saito; Appl. Phys. Lett., 55 (1989) 1489].

Saito et al. also proposed a three-layer structure organic electroluminescent element wherein an organic luminescent layer is interposed between a hole-transport layer and an electron-transport layer [C. Adachi, S. Tokito, T. Tsutsui and S. Saito; Jpn. J. Appl. Phys., 27 (1988) L269].

The two-layer structure element of Saito et al. is, as shown in FIG. 19(b), composed of an anode 91, a hole-transport luminescent layer 95, an electron-transport layer 96 and a cathode 94, which are formed in this order on a glass substrate 90. In contrast to the previous element, the electron-transport layer 96 not only allow electrons to be injected from the cathode 94 into the hole-transport luminescent layer 95, but prevents the holes injected from the anode 91 from escaping into the cathode 94 avoiding the recombination with the electrons, so that the holes are contained into the hole-transport luminescent layer 95. This hole containment effect due to the electron-transport layer 96 realizes a substantial decrease in drive voltage likewise in the previous element.

The three-layer structure element of Saito et al. was attained by a further improvement in the element of Tang et al. As shown in FIG. 19(c), this element is composed of an anode 91, a hole-transport layer 92, a luminescent layer 97, an electron-transport layer 96 and a cathode 94, which are formed in this order on a glass substrate 90. The hole-transport layer 92 contains electrons into the luminescent layer 97, and the electron-transport layer 96 contains holes into the luminescent layer 97, so that the recombination of the electrons and the holes in the luminescent layer 97 is more efficient than the two-layer structure element.

Further, the electron-transport layer 96 and the hole-transport layer 92 prevent excitons generated by the above recombination from escaping into either an anode or a cathode. Therefore, the three-layer structure element of Saito et al. increases luminous efficiency furthermore.

Examples of hole-transport material which constitute the above organic electroluminescent elements are aromatic tertiary amines such as triphenylamine. Examples of electron-transport material are oxadiazoles. Examples of luminescent material are tetraphenybutadiene derivatives, tris(8-quinolinolato)aluminum (III) complex, distyrylbenzene derivatives, distyrylbiphenyl derivatives.

Advantages of the above organic electroluminescent elements are that they can emit light of high luminance at a lower voltage than a conventional electroluminescent element employing inorganic luminescent material, and that they can easily increase the surface area because the respective layers can be formed not only by vacuum deposition but solution application, and that they can emit light of multi-color depending upon molecular design for organic molecule. Each element, however, has the disadvantage that luminance decrease significantly with a long-term emission. It is therefore the urgent problems to improve stability and to extend the life.

In the meantime, the conventional electroluminescent elements have the disadvantage that it is difficult to emit blue light irrespective of organic/inorganic or single/plural layer.

For example, the inorganic element has a problem that an inorganic light emission material with a wide band gap required for blue light emission is limited. Moreover, such a material is often accompanied by technical difficulties in crystal growth or thin film production, thereby making it difficult to produce an element from this material.

On the other hand, in the organic material, although multi-color due to molecular design can be obtained as described above, there are small number of material capable of emitting blue light. The known examples are merely anthracene and distyrylbenzene derivative of which luminous efficiency is insufficient. Accordingly, for practical applications they are far from adequate.

Further, every conventional electroluminescent element is for a single color light emission. It is therefore impossible at present to realize, by using one element, light emission of more than two mutually different spectrums which enables a multi-color display due to three primary color emissions: R (Red); G (Green); and B (Blue), and white light emission.

In order to solve the above problem, Ogura et al. proposed a three-layer structure element employing a bis-di(p-tolyl) aminophenyl-1,1-cyclohexane as a diamine derivative for a hole-transport layer, a 1,1-di(p-methoxyphenyl)-4,4-diphenylbutadiene as a tetraphenylbutadiene derivative for a luminescent layer and a 2-(4-biphenylyl)-5-(4-tertbutylphenyl)-1,3,4-oxadiazole as an oxadiazole derivative for an electron-transport layer [Sharp Technical Journal, 52 (3), 15–18 (1992)].

This element has a peak of emission spectrum at wavelengths of 480 nm and 590 nm, and emits white light. The light having the wavelength of 480 nm is due to the luminescent layer having hole-transport properties, while that having a wavelength of 590 nm is due to the hole-transport layer. Ogura et al. described that the mechanism of light emission from the hole-transport layer is based on diffusion of excitons from the luminescent layer.

Mori et al. proposed an organic electroluminescent element comprising a single luminescent layer, wherein luminescent material such as a coumarin 6 and a coumarin 7 being known as a laser dye, and an oxadiazole derivative as an electron-transport material are molecularly dispersed in a high-molecular poly-N-vinyl carbazol which serves as a hole-transport material and a resin binder. It is their opinion that various color light emissions are available by selecting the kind of dye to be molecularly dispersed in the luminescent layer [Oyo Buturi 61(10), 1044–1047 (1992)].

This element may realize a multi-color display due to three primary colors of R, G and B or white light emission by selecting the dye kind and the dye combination.

In contrast, the three-layer structure element of Ogura has the disadvantage of being unstable due to a large drop in luminescent intensity during the use. It appears that this instability is caused by deterioration, coagulation or crystallization due to heat release when the element emits light.

In the single-layer structure element of Mori, the recombination of the holes and the electrons is insufficient and its luminance is low because of being a single-layer.

It is one object of the present invention to provide an organic electroluminescent element which is excellent in luminous efficiency, luminance and stability.

It is another object of the present invention to provide an organic electroluminescent element capable of emitting such color light, particularly blue light, at sufficient efficiency, which has never been obtained or failed to emit light at high luminous efficiency.

It is still another object of the present invention to provide an organic electroluminescent element which can emit light of more than two mutually different emission spectrums, and which can emit color light such as multi-color display due to three primary colors and white light emission, which has never been obtained at sufficient efficiency or failed to emit it at high luminous efficiency.

DISCLOSURE OF THE INVENTION

The first organic electroluminescent element of the present invention comprises at least one layer of a 1,2,4-triazole derivative.

The low-molecular 1,2,4-triazole derivative (the term "low-molecular" used herein is not shown by molecular weight, but means that it has no main chain structure like a high-molecular 1,2,4-triazole derivative described later) have never been employed as an organic electroluminescent material until the present inventors do so.

Although the 1,2,4-triazole derivative is not valid for a hole-transport material, if employed as an electron-transport material, it presents electron-transport properties and hole-blocking properties superior to those of other conventional materials. Thus the efficiency of the recombination of electron and holes increases and that of containment of excitons generated by the above combination increases, both contributing a further increase in luminous efficiency, luminance of the luminescent layer and stability accompanied thereby. Particularly, the combination of this derivative and a conventional luminescent layer for blue light emission which has high hole-transport properties, can raise luminous efficiency and luminance to a required level for practical applications. This realizes such blue light emission having high luminance as previously described.

For the low-molecular 1,2,4-triazole derivative, a 3-(4-biphenylyl)-4-phenyl-5-(4-tert-butylphenyl)-1,2,4-triazole (hereinafter referred to as "TAZ") expressed by the formula:

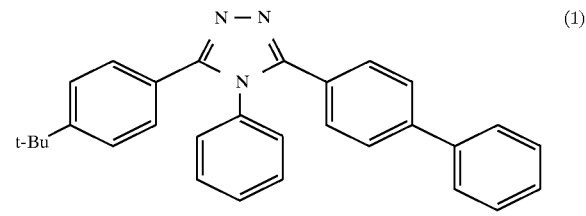

is preferred because it is excellent in both electron-transport properties and hole-blocking properties.

The second organic electroluminescent element of the present invention is characterized by a carrier-transport control layer for selectively transporting holes or electrons, which is interposed between a hole-transport layer and an electron-transport layer.

In this element, the exciton containment effect due to a carrier-transport control layer composed of material such as the low-molecular 1,2,4-triazole derivative, which selectively transports holes or electrons, provide the hole-transport layer or the electron-transport layer with high luminance and high luminous efficiency as a luminescent layer. It is therefore possible to increase luminous efficiency and luminance as well as stability accompanied thereby. Hence, the use of a hole-transport layer composed of material capable of emitting blue light emission(e.g. the poly-N-vinyl carbazole) along with an electron-transport layer promotes luminous efficiency and luminance for blue light emission to a required level for practical applications.

Besides, by selecting the material and film thickness for the carrier-transport control layer, it is possible to allow the hole-transport layer and/or electron-transport layer to emit light at high luminance and high luminous efficiency. Therefore, one element can emit more than two mutually different emission spectrums, by using different emission spectrum materials for the hole-transport layer and electron-transport layer. This might result in the practical use of light emission such as the multi-color display due to three primary colors of R, G and B, and white light emission.

The third organic electroluminescent element of the present invention is characterized in that at least one electron-transport layer and at least one hole-transport luminescent layer are provided and that the hole-transport luminescent layer is formed by molecularly dispersing at least one kind of dye in a polymer.

Specifically, the hole-transport luminescent layer has heat resistance superior to that of a conventional hole-transport layer of a low-molecular material, and is also excellent in adhesion to a substrate such as ITO glass and ITO film. It is therefore possible to form a hole-transport luminescent layer wherein there hardly occurs deterioration, aggregation, crystallization or the like due to heat release when the element emits light, resulting in an increase in stability.

Compared to a single-layer element, the combination of the aforesaid hole-transport luminescent layer and an electron-transport layer increases furthermore carrier injection efficiency and the recombination efficiency for holes and electrons, resulting in light emission having high luminous efficiency and high luminance.

Besides, a dye can be easily dispersed in a polymer by adjusting a solution. It is therefore possible to disperse plural dye in one hole-transport luminescent layer. This realizes a multi-color display having good color purity due to three primary color, white light emission and natural light emission, depending upon the dye kind or the dye combination.

The fourth organic electroluminescent element of the present invention is characterized in that there is provided with a hole-transport layer which contains, as a hole-transport material, a high-molecular 1,2,4-triazole derivative (hereinafter referred to as "PTAZ") of a repeating unit expressed by the general formula (6):

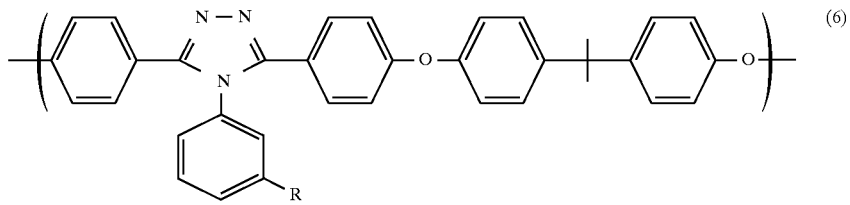

wherein R denotes at least one member selected from the group consisting of a hydrogen atom, a methyl group and an ethyl group.

The fifth organic electroluminescent element of the present invention is characterized in that there is provided with a hole-transport layer which contains the PTAZ as a resin binder, and in the hole-transport layer a low-molecular hole-transport material is molecularly dispersed in the PTAZ.

The PTAZ used in these elements has never been employed as a material for organic electroluminescent elements until the present inventors do so.

As seen from its molecular structure, the PTAZ is applicable to a hole-transport material, and yet it is polymer. Accordingly, it has heat-resistance superior to that of a conventional low-molecular hole-transport material. It is therefore possible to form a hole-transport layer wherein there hardly occurs deterioration, crystallization due to heat release when the element emits light.

The PTAZ has a higher glass transition temperature (about 200° C. or more) than a normal polymer such as polycarbonate, and is excellent in optical characteristics. Therefore, if employed as a resin binder for a so-called molecular-dispersion hole-transport layer wherein a low-molecular hole-transport material is molecularly dispersed in a resin binder, it is possible to prevent such a hole-transport material from causing aggregation or crystallization due to the aforesaid heat release.

Accordingly, the PTAZ is greatly useful in increasing stability, luminous efficiency and luminance for an element.

In the fifth element of the present invention, the PTAZ prevents a luminescent material being excited by the recombination of carriers from forming exciplex together with the hole-transport material. As a result, the luminescent material emits light at high efficiency, thus increasing luminous efficiency of the element. Particularly, the combination of the PTAZ and a conventional luminescent material for blue light emission whose luminous efficiency is low can raise the luminous efficiency to a required level for practical applications.

As described above, the first to fifth organic electroluminescent elements of the present invention can emit color light as previously mentioned, particularly blue one. Further, these organic electroluminescent elements can emit light of more than two mutually different emission spectrums, and can emit color light such as a multi-color display due to three primary colors and white light emission, which has never been produced with sufficient efficiency or has been failed to emit it at high luminous efficiency.

BRIEF DESCRIPTION OF DRAWINGS

FIGS. 2(a) to 2(c) are schematic diagrams illustrating the principle of light emission of an element wherein the film thickness of the TAZ layer as a carrier-transport control layer is sufficiently large, among the three-layer structure of the second organic electroluminescent element.

FIG. 4(a) to 4(c) are schematic diagrams illustrating the principle of light emission of an element wherein the film thickness of the TAZ layer as a carrier-transport control layer is intermediate between those of FIGS. 2 and 3.

FIG. 5(a) to 5(c) are schematic diagrams illustrating the principle of light emission of an element having a two-layer structure wherein no TAZ layer is interposed between the TPD layer as a hole-transport layer and the Alq layer as an electron-transport layer.

FIG. 12 is a graph illustrating the measurement results of emission spectrums of the second organic electroluminescent element prepared in Examples 7 and 8.

FIG. 17 is a graph illustrating the measurement results of the relation between drive voltage and luminance in the fifth organic electroluminescent element prepared in Example 16.

FIG. 18 is a graph illustrating the measurement results of an emission spectrum of the organic electroluminescent element prepared in Example 16.

FIGS. 19(*a*) to 19(*c*) are vertical sectional views illustrating the conventional organic electroluminescent elements.

BEST MODE FOR CARRYING OUT THE INVENTION

Figure 1:
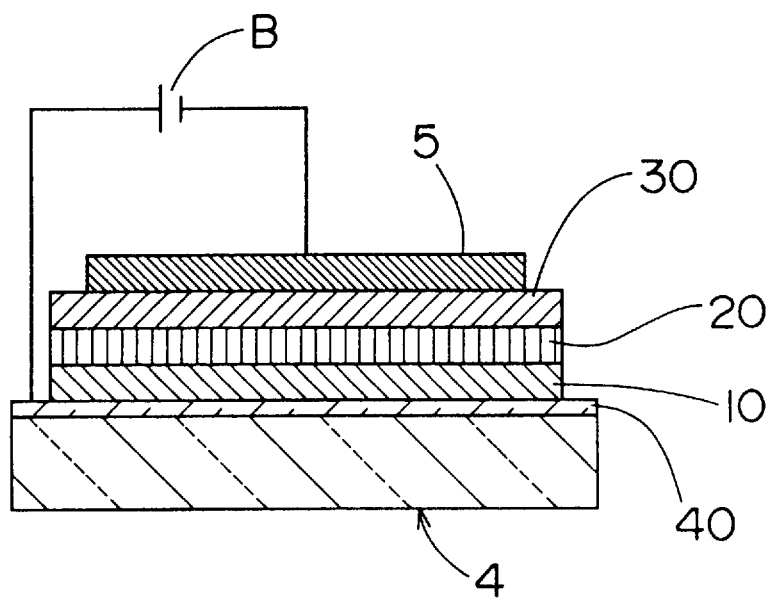
FIG. 1(a) is a vertical sectional view illustrating a preferred embodiment of the first organic electroluminescent element of the present invention.
FIG. 1(b) is a vertical sectional view illustrating one embodiment of the second organic electroluminescent element of the present invention.
Figure 1:
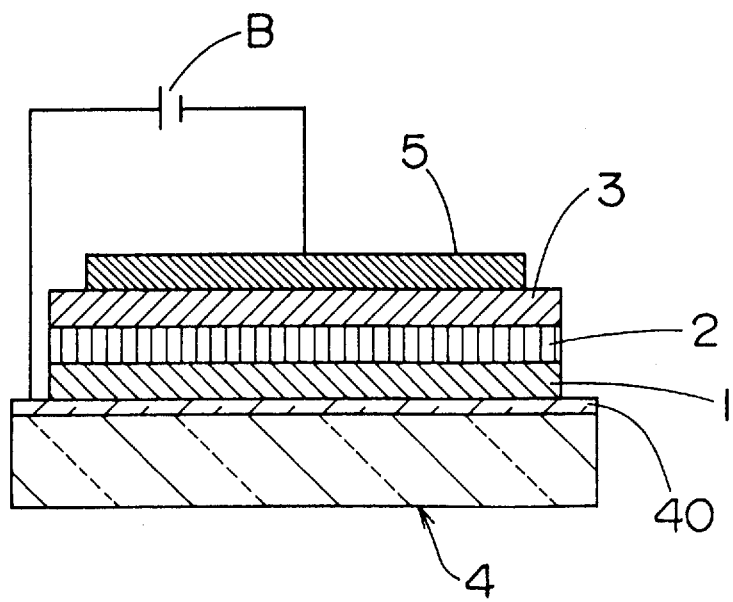

The present invention will be described in detail.

Followings are to describe the first organic electroluminescent element comprising at least one layer of a 1,2,4-triazole derivative.

The phrase "a layer of a 1,2,4-triazole derivative" used herein denotes a layer containing at least one kind of the low-molecular 1,2,4-triazole derivatives as previously described. There are, for example, a layer which solely comprises one or more kinds of the 1,2,4-triazole derivatives, and a layer wherein one or more kinds of the 1,2,4-triazole derivatives are dispersed in a suitable binder.

The 1,2,4-triazole derivative layer may contain other ingredients such as various additives, which do not inhibit its function.

The 1,2,4-triazole derivative layer can be formed by vapor phase deposition such as vacuum deposition, or solution application to apply, on a substrate or the other layer, a solution wherein a material constituting the layer is dissolved in a suitable solvent, followed by drying.

Various compounds can be employed for the 1,2,4-triazole derivative. Most preferred is a TAZ expressed by the formula:

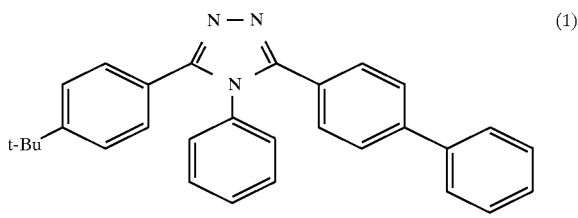

(1)

because it is excellent in both electron-transport properties and hole-blocking properties.

The film thickness of this derivative layer is not specifically limited in the present invention. But if it is too thin, hole-block properties become insufficient and, therefore it requires a certain amount of thickness. Although its suitable range is not specifically limited, its lower limit is preferably a range from 100 to 200 Å for a vapor deposited film of the PAZ expressed by the formula (1), in order to hold a sufficient hole-blocking properties.

Although its upper limit is not specifically limited, if this layer is too thick, electron-transport properties decreases. For example, it is desired to be not more than 1000 Å for the vapor deposited film of the TAZ.

The 1,2,4-triazole derivative layer is essential to the first organic electroluminescent element. There are no other construction restrictions. That is, it may be either a conventional single-layer structure or a multi-layer structure. In short, the construction of the first element is applicable to any layers irrespective of the construction kind.

In an element having the multi-layer structure, no particular restrictions to other layers than the 1,2,4-triazole derivative layer. There can employ various conventional materials used for the respective layers. Also, there are no restrictions for the film thickness of each layer constituting the element. Each layer can be formed by the aforesaid solution application and vapor phase deposition as in the 1,2,4-triazole derivative layer. Each layer may contain other ingredients such as resin binders and various additives, which do not directly affect the function of the layer.

In this element, since the layer of the 1,2,4-triazole derivative presents excellent electron-transport properties and hole-blocking properties as described above, it is possible to emit blue light emission at high luminance which has been difficult to realize by the combination of the 1,2,4-triazole derivative layer as an electron-transport layer and the hole-transport luminescent layer for blue light emission, which has high hole-transport properties.

Most preferred hole-transport luminescent layer for blue light is a layer of poly-N-vinylcarbazole (hereinafter referred to as "PVK") expressed by the formula:

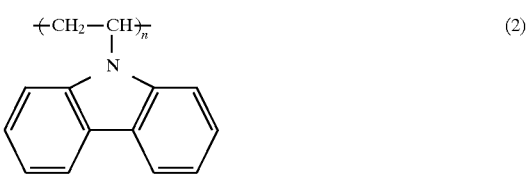

(2)

wherein n is a polymerization degree.

The PVK layer has high hole mobility and, therefore holes injected into the layer escape into a cathode, thus normally failing to emit light. However, the blue light emission can be obtained by combining the PVK layer with the 1,2,4-triazole derivative layer which is excellent in the excitons containment and high hole-blocking properties.

Further, the PVK also performs the function of the hole-transport material as seen from its molecular structure, and has heat resistance superior to the conventional hole-transport materials such as the low-molecular aromatic tertiary amine compounds as previously described, because it is a polymer. Therefore, it is possible to form a hole-transport luminescent layer for blue light emission wherein there hardly occurs deterioration or crystallization due to heat release on storage or light emission of the element.

Moreover, the PVK layer is excellent in adhesion to substrates such as ITO glass and ITO film.

Hence, the combination of the PVK layer as a hole-transport luminescent layer and the 1,2,4-triazole derivative layer realizes an organic electroluminescent element for blue light emission that presents excellent luminous efficiency, luminance and stability and that can be put to practical use.

The polymerization degree n of the PVK is not specifically limited in the present invention, but it is preferably about 20 to 5000. If it is below this range, heat resistance and adhesion tend to be insufficient. On the other hand, if it is beyond this range, the layer formation by solution application might be difficult.

More preferred element of the combination of the 1,2,4-triazole derivative layer and the PVK layer (a hole-transport luminescent layer) is that having a three-layer structure wherein a layer of a tris(8-quinolinolato)aluminum (III) complex (hereinafter referred to as "Alq") expressed by the formula:

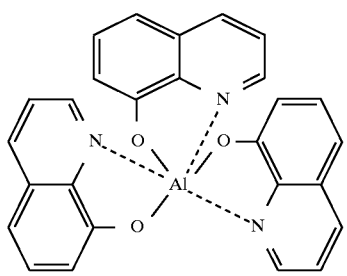

(3)

is provided as an electron-transport layer. In this element, the action of the Alq layer promotes electron injecting properties to the hole-transport luminescent layer, thus, obtaining blue light emission having high luminance at higher efficiency.

The layer construction of the three-layer structure element is not specifically limited. But, if consideration is given to the fact that the PVK layer is excellent in adhesion to substrates such as ITO glass and ITO film, and is formed exclusively by solution application, it is preferable to use an element wherein three layers: a hole-transport luminescent layer (a PVK layer) 10, a layer of a 1,2,4-triazole derivative (a TAZ layer) 20 and an electron-transport layer (an Alq layer) 30 are laminated in this order on an anode 40 of a transparent conductive material such as ITO (indium-tin-oxide) being formed on a glass substrate 4, as shown in FIG. 1(*a*). In FIG. 1(*a*), the reference numerals 5 and B denote a cathode of metal deposited film such as Mg/Ag and a power source for applying a drive voltage to the element, respectively.

The film thickness for the PVK layer 10 and the Alq layer 30 is not specifically limited in the present invention. There can set to an appropriate range depending upon the kind of the 1,2,4-derivative to be used and the film thickness of the layers.

Since the PVK layer is a polymer, the PVK layer 10 can be formed by the aforesaid solution application.

The Alq layer 30 contains at least the Alq. For example, there are a layer consisting the Alq alone or a layer wherein the Alq is dispersed in a suitable binder. The Alq layer 30 can be formed by the aforesaid solution application and vapor phase deposition.

The PVK layer 10 and the Alq layer 30 may contain other ingredients such as various additives, which do not inhibit the functions of the PVK and the Alq.

Followings are to describe the second organic electroluminescent element having a three-layer structure comprising a carrier-transport control layer, which is interposed between a hole-transport layer and an electron-transport layer.

This element is, as shown in FIG. 1(*b*), composed of laminated three layers: a hole-transport layer 1; a carrier-transport control layer 2 and an electron-transport layer 3, which are formed in this order or in the reverse order, on an anode 40 of a transparent conductive material such as ITO (indium-tin-oxide) being formed on a glass substrate 4. It is essential that the layer 2 is sandwiched between the layers 1. and 3. In FIG. 1(*b*), reference numerals 5 and B denote a cathode of metal deposited film such as Mg/Ag and a power source for applying a drive voltage to the element, respectively, likewise in FIG. 1(*a*).

Most preferred carrier-transport control material for the carrier-transport control layer 2 is the 1,2,4-triazole derivative such as the TAZ.

There are, for example, a 1,3,4-oxadiazole derivative being known as an electron-transport material. There can employ various compounds for this derivative. More preferred is a 2-(4-biphenylyl)-5-(4-tert-butylphenyl)-1,3,4-oxadiazole (hereinafter referred to as "PBD") expressed by the formula:

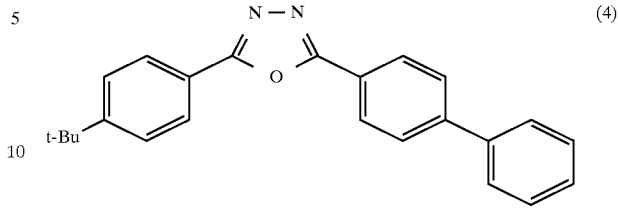

(4)

There can also employ various conventional compounds which have been used as an electron-transport material or hole-transport material.

The carrier-transport control layer 2 functions such that either or both of the hole-transport layer 1 or/and electron-transport layer 3 emit light at high luminance and high efficiency depending upon its material and its film thickness as previously described.

The function of the carrier-transport control layer 2 will be described through an example where there employs a vapor deposited film of the TAZ (the TAZ layer) as a carrier-transport control layer 2, a vapor deposited layer of a N,N'-diphenyl-N,N'-bis(3-methylphenyl)-1,1-biphenyl-4,4-diamine (hereinafter referred to as "TPD") expressed by the formula:

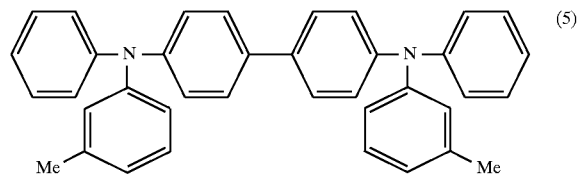

(5)

(the TPD layer) as a hole-transport layer 1 and a vapor deposited film of the Alq (the Alq layer) expressed by the formula (3) as an electron-transport luminescence layer 3.

In general, carrier injection into an organic insulating film is restricted by space charge. The current capacity that passes through the organic insulating film is proportional to the mobility of carriers and the square of the electric field strength, and is inversely proportional to the cubic of the film thickness of the organic insulating film. That is, the larger the electric field strength and mobility, the more carrier injection is accelerated. The larger the film thickness, the more carrier injection is restricted.

In an element of a two-layer structure (which corresponds to the element of Tang et al.) being composed of a TPD layer 1 and an Alq layer 3 as shown in FIG. 5, when a bias voltage is applied between an anode 40 and a cathode 5, holes are firstly injected into the TPD layer 1 and blocked on the TPD/Alq interface to form space charge (FIG. 5(*a*)).

At this time, the electric field strength applied on the Alq layer 3 becomes larger than the apparent electric field strength applied between a couple of electrodes 40, 5 because of the space charge on the TPD/Alq interface, thereby initiating an electron injection into the Alq layer 3 (FIG. 5(*b*)).

Then, excitons are generated by the recombination of the holes and the electrons on the Alq layer 3 in the vicinity of the TPD/Alq interface (FIG. 5(*c*)), and the Alq is excited to emit light.

When the TAZ layer is interposed between the TPD layer 1 and Alq layer 3, the injection order for holes and electrons are the same. When the film thickness of the TAZ layer 2 is sufficiently large (for example, about 150 Å or more) as shown in FIG. 2, the TAZ layer 2 exhibits excellent hole-blocking properties similar to the first element, so that holes thus injected are blocked at the TPD/TAZ interface (FIG. 2(a)).

Electrons which are being injected into the Alq layer 3 by the formation of the space charge due to the holes are transported to the TPD/TAZ interface because the TAZ layer 2 is excellent in electron-transport properties (FIG. 2(b)), and excitons are generated by the recombination of the holes and the electrons (FIG. 2(c)) and the TPD whose excitation energy level is lower than that of the TAZ is excited by the excitons thus generated to emit light.

Figure 3A:
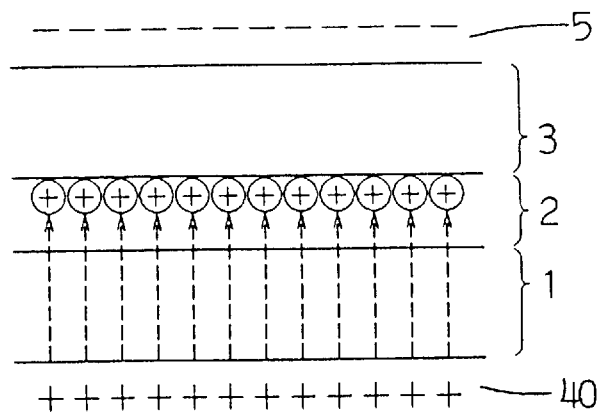
FIG. 3(a) to 3(c) are schematic diagrams illustrating the principle of light emission of an element wherein the film thickness of the TAZ layer as the carrier-transport control layer is sufficiently small.

On the other hand, when the film thickness of the TAZ layer 2 is sufficiently small (for example, about 50 Å or less), as shown in FIG. 3, holes injected into the TPD layer 1 by applying a bias voltage between a couple of electrodes 40, 5 pass through the TAZ layer 2 and blocked at the TAZ/Alq interface to form space charge (FIG. 3(a)). The reason why the holes pass through the TAZ layer 2 is that the injection amount of carriers (the holes in this case) is inversely proportional to the cubic of the film thickness of the TAZ layer 2 being the organic insulating film.

Figure 3B:
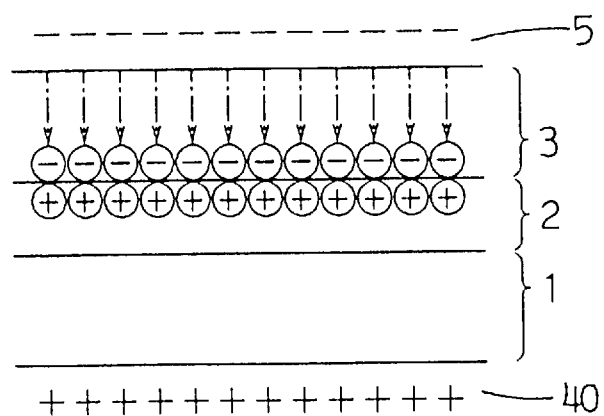
Figure 3C:
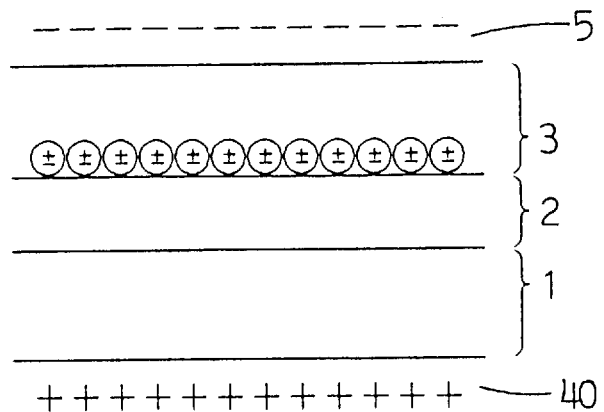

Then, electrons injects into the Alq layer 3 by the formation of the space charge due to holes (FIG. 3(b)), and excitons are generated by the recombination of the holes and the electrons on the TAZ/Alq interface (FIG. 3(c)), and then the Alq whose excitation energy level is lower than that of the TAZ is excited by the excitons thus generated to emit light.

Still further, when the film thickness of the TAZ layer 2 is intermediate between the above value (in case of being in a range from about 50 to about 150 Å), some of the holes which are injected into the TPD layer 1 by applying a bias voltage between a couple of electrodes 40, 5 are blocked on the TPD/TAZ interface, the others pass through the TAZ layer 2 and are blocked on the TAZ/Alq interface (FIG. 4(a)).

When electrons are injected into the Alq layer 3 by the formation of the space charge due to the holes (FIG. 4(b)), excitons are generated by the recombination of the holes and the electrons on both TPD/TAZ and TAZ/Alq interfaces (FIG. 4(c)) and the TPD and the Alq whose excitation energy levels are lower those of the TAZ are excited by the excitons thus generated to emit light.

The reason why the injected holes are divided into two types in the foregoing is that the injection amount of the holes is inversely proportional to the cubic of the film thickness of the TAZ layer 2, as described above.

Since the TAZ layer of the element in FIG. 4 allows both of the holes and the electrons to pass through, there might have a chance that the recombination of both may occur in the TAZ layer 2. The TAZ, however, has a peak light emission at a shorter wavelength region of not more than 4000 nm. Even if the TAZ is excited by the excitons generated by the above recombination, excitation energy is transported to either or both of the TPD layer or/and the Alq layer, each having a peak light emission at a longer wavelength region. Consequently, the TAZ layer 2 itself emits no light.

As is evident from the above description, the function of the TAZ layer can be changed by adjusting its film thickness within the above range, in the combination of the TPD layer 1, the TAZ layer 2 and the Alq layer 3. However, the relation between the functions of the carrier-transport control layer 2 and its film thickness may not necessarily correspond with the above examples. The range of the film thickness of the layer 2 having a specific function varies depending upon factors such as material constituting the respective layers, the layer structure (e.g. a vapor deposited film, a binder dispersed film, etc.).

In the above layers' combination, when using a vapor deposited film of the PBD (the PBD layer) whose electron-transport properties is lower (i.e., hole-transport properties is higher) than that of the TAZ layer in place of the TAZ layer, it is found that the PBD layer does not show hole-block properties equal to that of the TAZ layer having the same film thickness as the PBD because the hole injection amount is proportional to the mobility. Therefore, in order to provide the PBD layer with the same function as the TAZ layer, it is required to have a larger film thickness than the TAZ layer, which will be evident from Examples described later.

As seen from the description as to FIG. 4, it is possible to change the ratio for the luminescence intensity of the hole-transport layer 1 and the electron-transport layer 3 by adjusting the film thickness of the carrier-transport control layer 2 because the hole injection amount of the layer 2 such as the TAZ layer is inversely proportional to the cubic of its film thickness.

Accordingly, the combination of the hole-transport layer 1 and electron-transport layer 3 which emit light at different spectrums likewise in the combination of the TPD layer and the Alq layer, also offers the advantage that the color tone of the overall emission color being a mixed color of both layers' emission colors can be finely adjusted by suitably selecting the film thickness of the carrier-transport control layer 2.

In the second element, it is essential to have three layers: a hole-transport layer 1; a carrier-transport control layer 2 and an electron-transport layer 3. No particular restrictions are imposed upon other constructions.

The carrier-transport control layer 2 may be solely composed of the carrier-transport control material such as the TAZ and the PBD, or may be formed by dispersing a carrier control material in a suitable binder. The carrier-transport control layer 2 may contain other ingredients such as various additives, which do not inhibit its function.

The respective layers including the carrier-transport control layer 2 can be formed by the aforesaid solution application or vapor phase deposition.

Followings are to describe the third organic electroluminescent element wherein a hole-transport luminescent layer is formed by molecularly dispersing at least one kind of dye in a polymer.

The polymer constituting the hole-transport luminescent layer may or may not have carrier-transport properties. When using the polymer having no carrier-transport properties, there may provide it with hole-transport properties by molecularly dispersing a low-molecular hole-transport material along with a dye.

Examples of the polymer having carrier-transport properties include polyphenylenevinylene and its derivative, polyalkylthiophene, the PVK, polymethylphenylsilane, polymer having a triphenylamine group at a side chain or main chain, among others. Most preferred is the PVK because its carrier-transport properties is stable.

The polymerization degree n of the PVK is preferably about 20 to 5000 for the same reason above-mentioned.

For the polymer having no carrier-transport properties, there can employ various polymer having excellent optical characteristics. For example, there are polymethyl methacrylate, polycarbonate, polystyrene, polysulfon, polyether sulfon, polyallylate.

For dye to be molecularly dispersed in the polymer, there can employ various dyes such as the aforesaid dyes for laser, which can be excited by excitons to generate fluorescence. Examples of this dye include cyanine dye, xanthene dye, oxazine dye, coumarin derivative, perylene derivative, acridine dye, acridone dye, quinoline dye, among others. More preferred are a tetraphenylbutadiene (blue light emission, hereinafter referred to as "TPB") expressed by the formula:

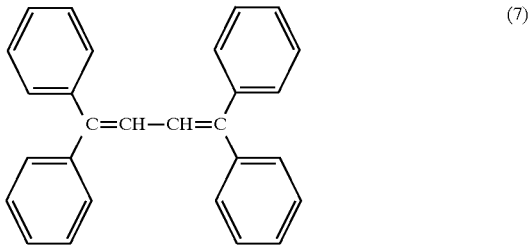
(7)

a coumarine 6 (green light emission) expressed by the formula:

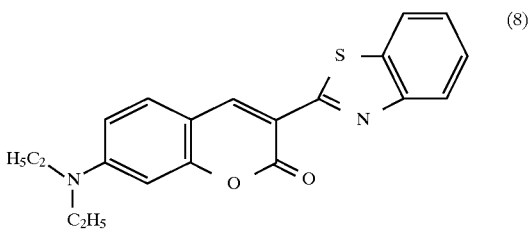
(8)

a coumarine 7 expressed by the formula:

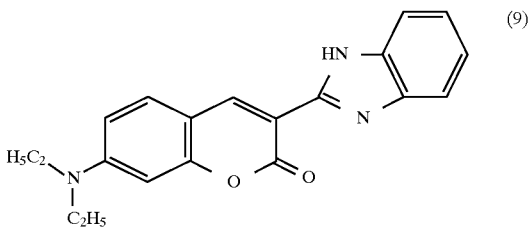
(9)

a 4-dicyanomethylene-2-methyl-6-p-dimethylaminostyryl-4H-pyran (orange emission, hereinafter referred to as "DCM") expressed by the formula:

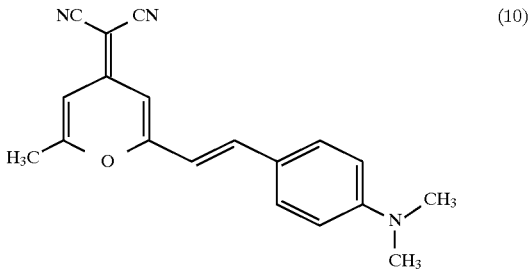
(10)

For white light emission, the combination of the TPB of the formula (7), the coumarine 6 of the formula (8) and the DCM of the formula (10) is appropriate. This combination allows the emission spectrum of the hole-transport luminescent layer to extend over the whole visible light region having a wavelength of 400 to 700 nm, resulting in a good white light emission.

The proportion of the dye formulated in a polymer is not specifically limited, and a preferable range can be set depending upon the kinds of polymer and dye, luminescence intensity, color tone and the like.

When using a polymer having no carrier-transport properties, it is suitable to use a triphenylamine derivative as a lower molecular hole-transport material to be molecularly dispersed in the polymer. More preferred is the TPD.

The hole-transport luminescent layer comprising the above respective components can be formed by the aforesaid solution application.

For an electron-transport layer used in the combination with the hole-transport luminescent layer, there can employ any layers composed of the conventional electron-transport materials. More preferred are the low-molecular 1,2,4-triazole derivative layer and the two-layer structure layer wherein the layer of the 1,2,4-triazole derivative and the Alq layer are laminated with each other.

Since the 1,2,4-triazole derivative is excellent both in electron-transport properties and hole-blocking properties, the recombination of electrons and holes can be sufficiently conducted in the hole-transport luminescent layer and, at the same time, generated excitons can be efficiently contained in the hole-transport luminescent layer, resulting in a further increase in luminous efficiency and luminance of the hole-transport luminescent layer.

A suitable example of the low-molecular 1,2,4-triazole derivative is the TAZ which is excellent in both electron-transport properties and hole-blocking properties.

Although the film thickness of the 1,2,4-triazole derivative layer is not specifically limited, if it is too thin, hole-blocking properties becomes insufficient. Thus it is desirable to have an ample film thickness. Although its suitable range is not specifically limited, 100 to 200 Å or more is appropriate for the vapor deposited film of the TAZ expressed by the formula (1) in order to hold a sufficient hole-blocking properties. The upper limit of its film thickness is not specifically limited, but electron-transport properties would decrease if it is too thick. Therefore, for the vapor deposited film of the TAZ, its film thickness is preferably not more than 1000 Å.

In the combination of the 1,2,4-triazole derivative layer and the Alq layer, electrons injection properties to the hole-transport luminescent layer increases further, thus obtaining an element being excellent in both luminous efficiency and high luminance.

The film thickness of the Alq layer is not specifically limited, but its film thickness is preferably about 100 to 1000 Å, in considering of the electron injection properties and the electron-transport properties to the hole-transport luminescent layer. If the Alq layer is laminated, it can be complementary to the hole-blocking properties of the 1,2,4-triazole derivative layer. Therefore, the film thickness of the 1,2,4-triazole derivative layer may be smaller than the aforesaid range for the vapor deposited film of the TAZ.

Although the total film thickness of both layers is not specifically limited, it is preferably about 200 to 1500 Å. If it is smaller than this range, hole-block properties tends to be insufficient. On the other hand, if it is larger than that, electron-transport properties tends to decrease.

The electron-transport layer such as the 1,2,4-triazole derivative layer and the Alq layer may be solely composed by an electron-transport material such as the 1,2,4-triazole derivative and the Alq, or be formed by dispersing an electron-transport material in a suitable binder. The electron-transport layer may contain other ingredients such as various additives which do not inhibit its function.

The electron-transport layer can be formed by the aforesaid solution application or vapor phase deposition.

The layer construction of the third element is not specifically limited.

Figure 6:
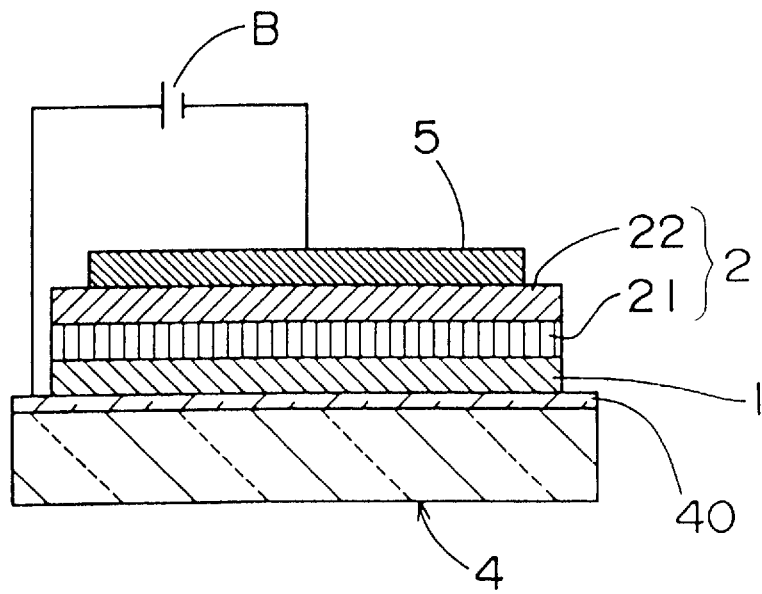
FIG. 6(a) is a vertical sectional view illustrating an element whose electron-transport layer has a two-layer structure, among the third organic electroluminescent element.
FIG. 6(b) is a vertical sectional view illustrating an element whose electron-transport layer is a single layer.
Figure 6:
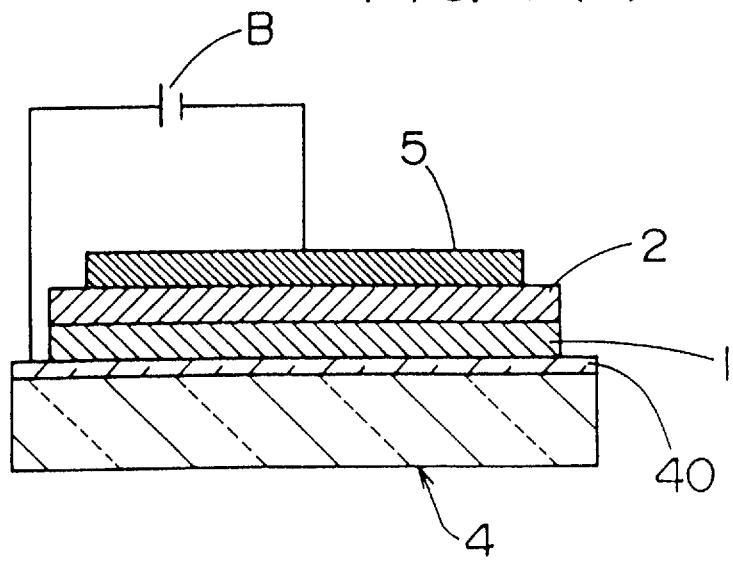

However, if considered that the polymer constituting the hole-transport luminescent layer is excellent in adhesion to substrates such as the ITO glass and the ITO film, and is formed exclusively by the solution application, it is preferable to use those prepared by laminating two layers: a hole-transport luminescent layer 11 and an electron-transport layer 31 on an anode 40 of a transparent conductive material such as ITO (indium-tin-oxide) being formed on a glass substrate 4 in this order, as shown in FIGS. 6(*a*) and 6(*b*).

The electron-transport layer 31 of FIG. 6(*a*) has a two-layer structure wherein two layers of the 1,2,4-triazole derivative layer (the TAZ layer) 31*a* and the Alq layer 31*b* are laminated on a hole-transport luminescent layer 11 in this order.

In FIGS. 6(*a*) and 6(*b*), the reference numerals 5 and B denote a cathode of metal deposited film such as Mg/Ag and Al/Li and a power source for applying a drive voltage to the element, respectively.

Followings are to describe the fourth organic electroluminescent element comprising a hole-transport layer which contains the PTAZ as a hole-transport material, and the fifth organic electroluminescent element comprising a hole-transport layer which contains the PTAZ as a resin binder in the present invention.

For the PTAZ expressed by the formula (6), there can suitably employ those having a repeating unit expressed by the formula:

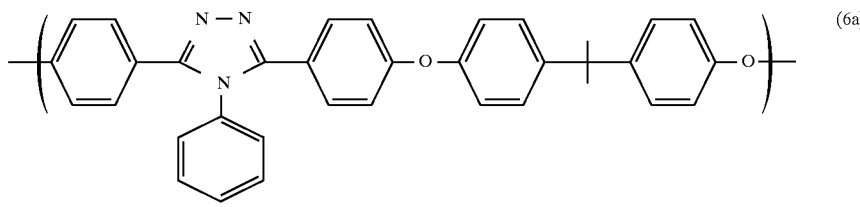

(6a)

(hereinafter referred to as "PTAZ-1") or those having a repeating unit expressed by the formula:

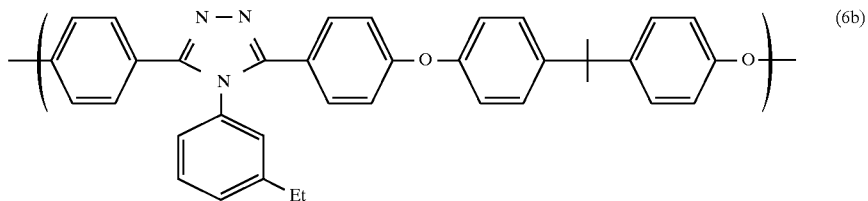

(6b)

(hereinafter referred to as "PTAZ-2").

The polymerization degree of the PTAZ is not specifically limited in the present invention, but it is preferably about 3000 to about 30000. If it is below this range, heat resistance tends to be insufficient. On the other hand, if it is beyond this range, the layer formation by the solution application might become difficult.

In the fourth element, one or more kinds of the PTAZ are used as a hole-transport material to form a hole-transport layer primarily composed of the PTAZ.

In the fifth element, one or more kinds of the PTAZ are used, as a resin binder, and a low-molecular hole-transport material is molecularly dispersed in the resin binder to form a hole-transport layer. The TPD is suitable for the low-molecular hole-transport material.

Both hole-transport layers may contain other ingredients such as various additives which do not inhibit the function of the PTAZ and the TPD.

The film thickness of the hole-transport layer is not specifically limited in the present invention, and it can be set to the optimum range depending upon the structure characteristics, namely, to which type it belongs.

The hole-transport layer can be formed by the aforesaid solution application.

In both elements, it is essential to have a hole-transport layer containing the PTAZ. No other particular restrictions are imposed thereon. There can employ either a conventional two-layer structure or a multi-layer structure comprising three or more layers. In short, the construction of both elements are applicable to any elements of various layer structures.

The layer material other than the hole-transport layer, which constitutes the element of the two-layer structure or the multi-layer structure, is not specifically limited in the present invention. There can employ various conventional materials used for the respective layers. Also, the film thickness of the respective layers constituting the element is not specifically limited in the present invention. The respective layers can be formed by the aforesaid solution application and vapor phase deposition, likewise in the hole-transport layer. Each layer may contain other ingredients such as resin binders and various additives which are not directly related to the layers' functions.

In every organic electroluminescent element of the present invention, a protective layer may be coated to shield the element against transmission of water or oxygen in air, or an element coated with the protective layer may be further sealed with a glass or a polymer, in order to improve storage stability in air or to extend the lifetime at the time of a continuous light emission.

FIELD OF INDUSTRIAL APPLICABILITY

As described above, every organic electroluminescent element of the present invention drives at a lower voltage, and is valid for producing a large-area luminescent element having flexibility because it is composed of organic material. Thus there is a great applicability in the fields of indication, illumination and display.

EXAMPLES

The invention will be better understood by the following Examples and Comparative Examples which show by way of example.

Example 1

On an ITO (indium-tin-oxide) coated glass substrate having a sheet resistance of 15 Ω/□ (ITO film thickness:

1500 to 1600 Å, manufactured by Asahi Glass Co., Ltd.), the TPD expressed by the formula (5) as a hole-transport material, the Alq expressed by the formula (3) as an electron-transport material and the TAZ expressed by the formula (1) as a 1,2,4-triazole derivative were deposited in this order by vacuum deposition to form a TPD layer, an Alq layer and a TAZ layer, respectively. The luminescent region was expressed by a square being 0.5 cm in side.

The deposition conditions for each layer

Ultimate vacuum degree: $2 \times 10^{-5}$ Torr;

Temperature of substitute: Room temperature; and

Deposition rate: 2 to 4 Å/sec.

Each film thickness

TPD layer (a hole-transport layer): 500 Å;

Alq layer (an electron-transport layer): 200 Å; and

TAZ layer: 300 Å.

Then, on the TAZ layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element. The deposition rate of the electrode layer was 11 Å/sec. and that of the protective layer was 10 Å/sec.

The ITO film and the Mg/Ag electrode layer thus prepared were used as an anode and a cathode, respectively, and a bias voltage was applied between a couple of electrodes at room temperature in air to allow the luminescent layer to emit light. Its luminance was measured using a luminance meter (Model No. LS-100, available from Minolta Co., Ltd.).

Figure 7:
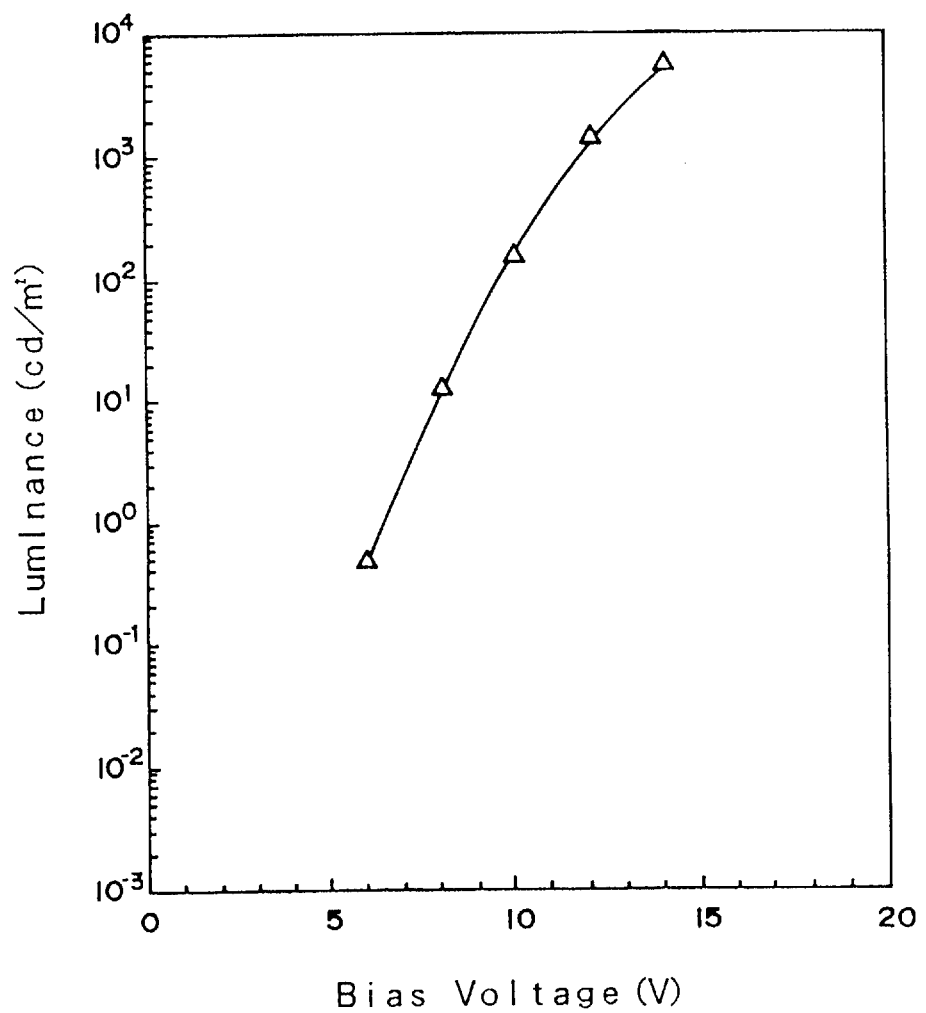
FIG. 7 is a graph illustrating the measurement results of the relation between drive voltage and luminance in the first organic electroluminescent element prepared in Example 1.

There observed green light emission of 5800 cd/m$^2$ in luminance at a drive voltage of a maximum 14 V (145 mA/cm$^2$) as shown in FIG. 7. This emission color proved that light emission originated from the Alq layer.

Example 2

On an ITO (indium-tin-oxide) coated glass substrate having a sheet resistance of 15 Ω/□ (ITO film thickness: 1500 to 1600 Å, manufactured by Asahi Glass Co., Ltd.), the PVK expressed by the formula (2) as a hole-transport luminescent material was coated by a dip coating using dichloroethane as a solvent to form a PVK layer, on which the TAZ expressed by the formula (1) as a 1,2,4-triazole derivative and the Alq expressed by the formula (3) as an electron-transport material were deposited in this order by vacuum deposition to form a TAZ layer and an Alq layer, respectively. The luminescent region was expressed by a square being 0.5 cm in side. The deposition conditions were the same as in Example 1.

Each film thickness was

PVK layer (a hole-transport luminescent layer); 400 Å;

TAZ layer: 200 Å; and

Alq layer (an electron-transport layer): 300 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element of the layer structure shown in FIG. 1(a). The deposition rates for the electrode layer and protective layer were the same as in Example 1.

The ITO film and the Mg/Ag electrode layer of the organic electroluminescence thus prepared were used as an anode and a cathode, respectively, and a bias voltage was applied between a couple of electrodes at room temperature in air to allow the luminescent layer to emit light. Its luminance was measured using the aforesaid luminance meter.

Figure 8:
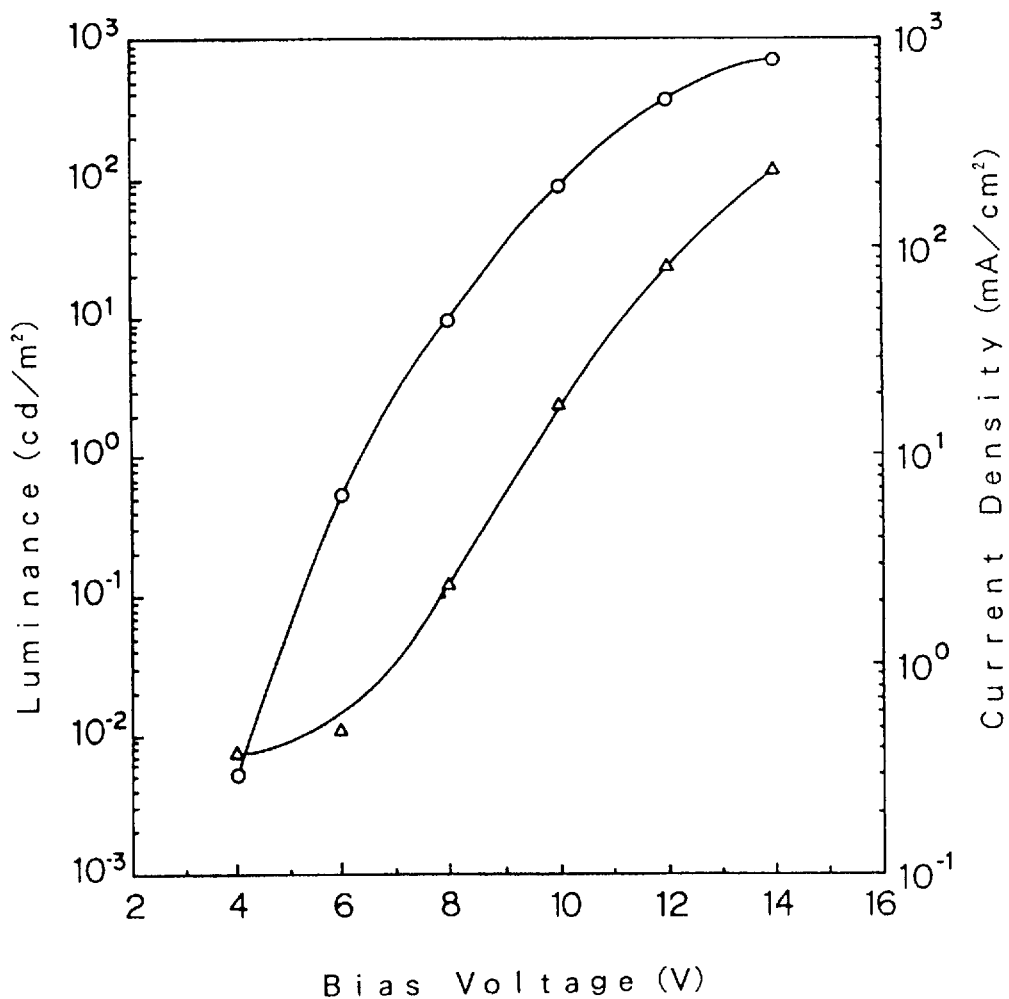
FIG. 8 is a graph illustrating the measurement results of the relation between drive voltage and luminance in the first organic electroluminescent element prepared in Example 2.

As a result, light emission was initiated from 4 V and there observed blue light emission of 700 cd/m$^2$ in luminance at a drive voltage of a maximum 14 V (220 mA/cm$^2$) as shown in FIG. 8. It showed that blue light emission of the element has outstanding high luminance in view of the CRT display's luminance at the blue color region being about 20 to 30 cd/m$^2$.

The blue light emission was measured at room temperature using a fluorophotometer (Model No. F4010 available from Hitachi Co, Ltd.).

Figure 9:
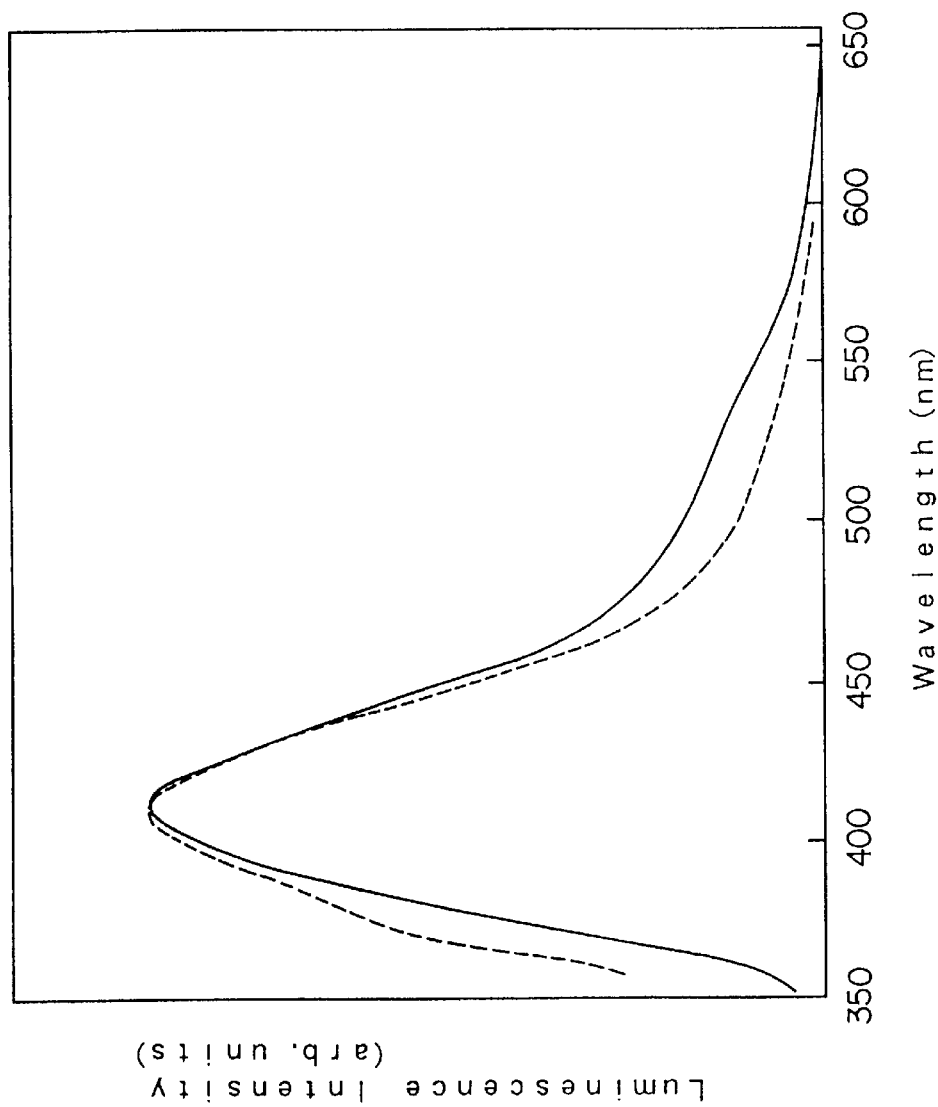
FIG. 9 is a graph illustrating the measurement results of an emission spectrum of the organic electroluminescent element prepared in Example 2.

There observed an emission spectrum having a peak at a wavelength of 410 nm as shown by a solid line in FIG. 9. The emission spectrum nearly corresponded to an emission spectrum of the PVK itself shown by a broken line in FIG. 9. This proved that light emission originated from the PVK layer of Example 2.

Even if the element was preserved at room temperature for several days, there observed no change in appearance, and the element emitted light at luminance similar to that before preservation.

Example 3

In the same manner as in Example 2 except that the Alq layer was omitted, an organic electroluminescent element was prepared and its characteristics was examined.

A voltage for initiating light emission became slightly large and a maximum current became small, but there obtained blue light emission with high luminance similar to Example 2.

Even if the element was preserved at room temperature for several days, there observed no change in appearance, and the element emitted light at luminance similar to that before preservation.

Comparative Example 1

In the same manner as in Example 2 except that the TAZ layer was omitted, an organic electroluminescent element was prepared and its characteristics was examined.

This element exhibited green light emission whose peak is at a wavelength of 530 nm. This emission color proved that the light emission originated from the Alq layer, not the PVK layer. This finding showed that the combination of the PVK layer and the TAZ layer is essential to allow the PVK layer to emit blue light.

Comparative Example 2

There prepared an organic electroluminescent element composed of the PVK layer alone wherein the TAZ layer and the Alq layer were omitted. The luminance of light emission was too weak to evaluate its luminance.

Example 4

On an ITO (indium-tin-oxide) coated glass substrate having a sheet resistance of 15 Ω/□ (ITO film thickness: 1500 to 1600 Å, manufactured by Asahi Glass Co., Ltd.), the TPD, the TAD and the Alq were deposited in this order by vacuum deposition to form a TPD layer, a TAD layer and an Alq layer, respectively. The luminescent region was expressed by a square being 0.5 cm in side. The deposition conditions were the same as in Example 1.

Each film thickness was as follows:

TPD layer (a hole-transport layer): 400 Å;

TAZ layer (a carrier-transport control layer): 150 Å; and

Alq layer (an electron-transport layer): 450 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element of the layer structure shown in FIG. 1(b). The deposition rates for the electrode layer and the protective layer were the same as in Example 1.

The ITO film and the Mg/Ag electrode layer thus prepared were used as an anode and a cathode, respectively, and a bias voltage was applied between a couple of electrodes at room temperature in air to allow the luminescent layer to emit light. Its luminance was measured using the aforesaid luminance meter.

Figure 10:
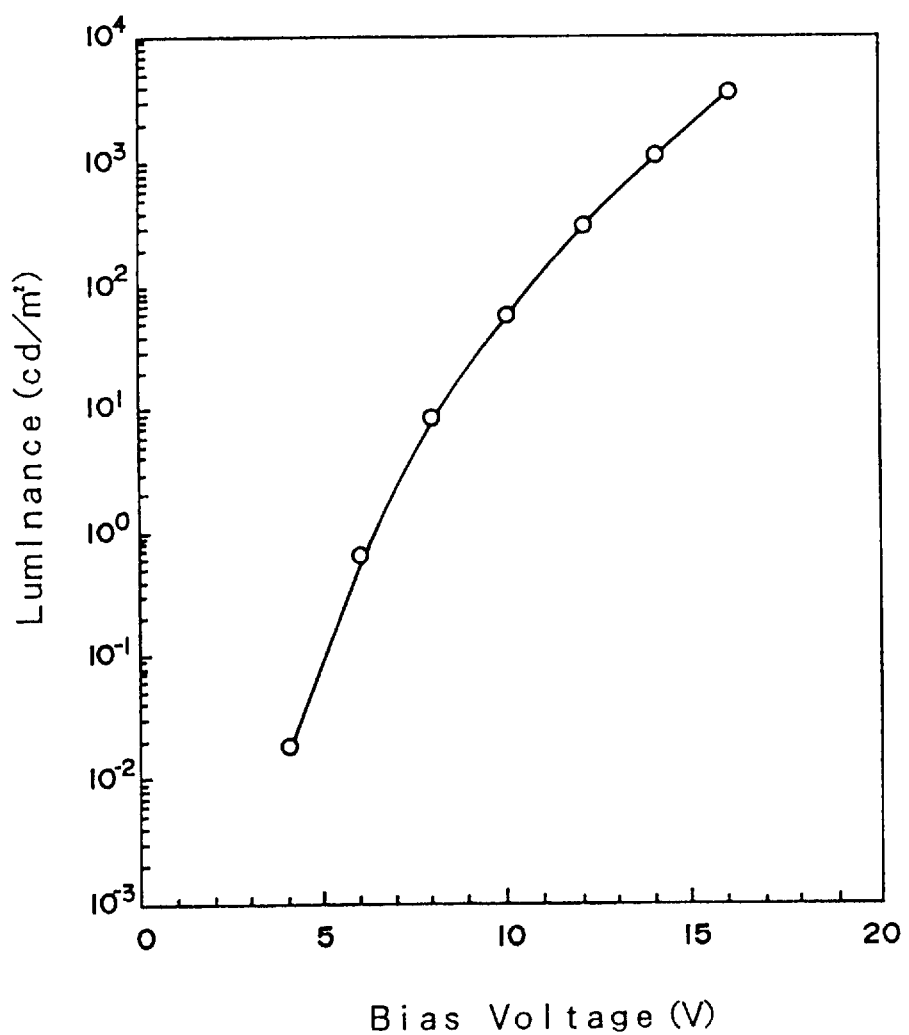
FIG. 10 is a graph illustrating the measurement results of the relation between drive voltage and luminance in the second organic electroluminescent element prepared in Example 4.

There observed blue light emission of 3700 cd/m$^2$ in luminance at a drive voltage of a maximum 16 V (145 mA/cm$^2$) as shown in FIG. 10.

Further, the blue light emission was measured at room temperature using the aforesaid fluorophotometer. There observed an emission spectrum having a peak at a wavelength of 464 nm, as shown by a solid line in FIG. 11. The emission spectrum nearly corresponded to the emission spectrum of the vapor deposited film composed of the TPD alone, shown by a short broken line in FIG. 11. This proved that the light emission originated from the TPD layer of Example 4.

Examples 5 and 6

There employed an organic electroluminescent element having the same layer structure as in Example 4, but the film thickness of the TAZ layer as a carrier-transport control layer was changed to 50 Å (Example 5) or 100 Å (Example 6) to measure each emission spectrum in the same manner as in Example 4.

Figure 11:
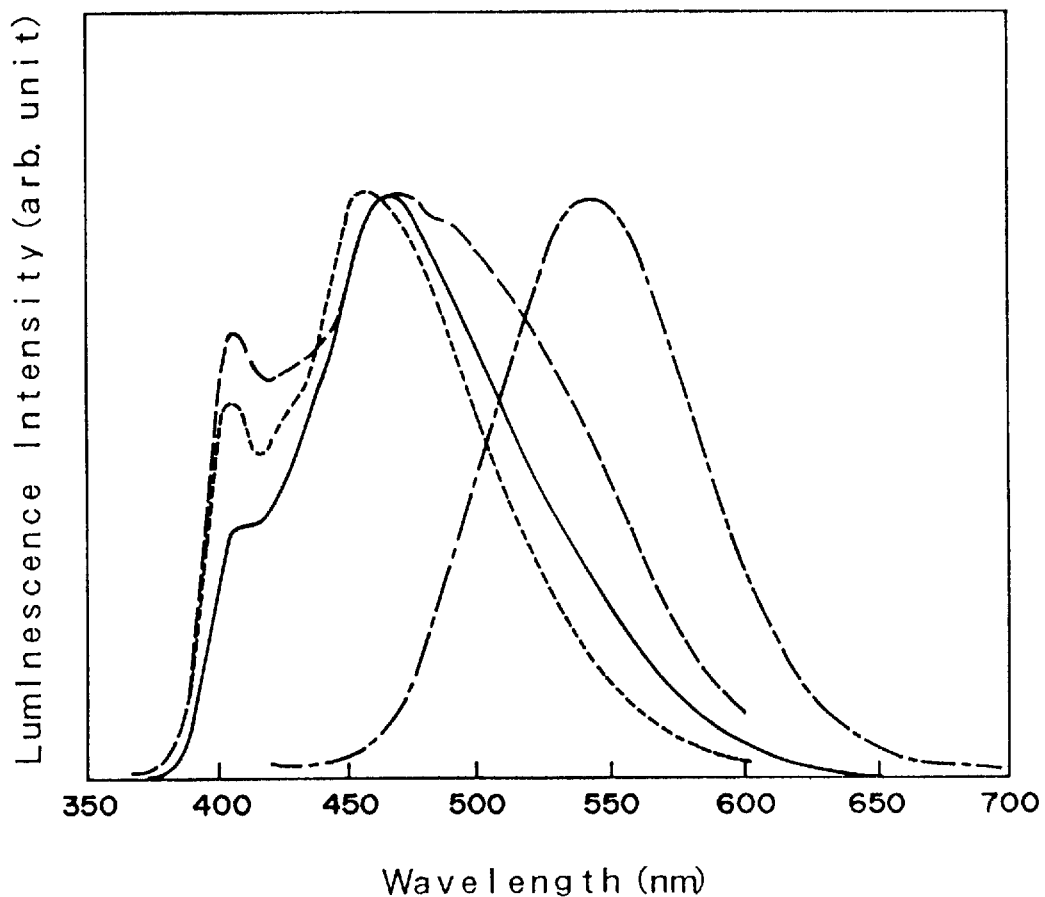
FIG. 11 is a graph illustrating the measurement results of emission spectrums of the second organic electroluminescent element prepared in Examples 4, 5 and 6.

As a result, Example 5 exhibited a green emission spectrum being luminescent color of the Alq layer, as shown by a chain line in FIG. 11.

In Example 6, such a green light emission became remarkably small and, at the same time, blue light emission being the emission color of the TPD layer became large, as shown by a long broken line in FIG. 11, resulting in blue-green light emission of both color emissions being mixed.

Examples 7 and 8

In the same manner as in Example 4 except that the PBD expressed by the formula (4), as a material constituting the carrier-transport control layer, was used instead of the TAZ, an organic electroluminescent element of the structure shown in FIG. 1(b) was prepared and its emission spectrum was measured.

The element whose PBD layer had a film thickness of 100 Å (Example 7) exhibited a green spectrum being the emission color of the Alq layer, as shown by a solid line in FIG. 12.

In the element whose TAZ layer had a film thickness of 300 Å (Example 8), as shown by a broken line in FIG. 12, there observed light emission of blue-green wherein green light emission being the luminescent color of the Alq layer was mixed with blue light emission being the luminescent color of the TPD layer.

Example 9

The PVK expressed by the formula (2), 5 molar % (for PVK) of the TPB expressed by the formula (7), 0.3 molar % (for PVK) of coumarine 6 expressed by the formula (8) and 0.3 molar % (for PVK) of the DCM expressed by the formula (10) were dissolved in dichloromethane to prepare an application solution. The application solution was applied on an ITO (indium-tin-oxide) coated glass substrate having a sheet resistance of 15 Ω/□ (ITO film thickness: 1500 to 1600 Å, manufactured by Asahi Glass Co., Ltd.) by dip coating, followed by drying to form a hole-transport luminescent layer.

Then, on the hole-transport luminescent layer, the TAZ expressed by the formula (1) and the Alq expressed by the formula (3) as an electron-transport material were deposited in this order by vacuum deposition to form an electrontransport layer of a two-layer structure. The luminescent region was expressed by a square being 0.5 cm in side. The deposition conditions for the TAZ layer and Alq layer were as follows:

Ultimate vacuum degree: 1 to 2×10$^{-5}$ Torr;

Temperature of substrate: Room temperature; and

Deposition rate: 2 to 4 Å/second.

Each film thickness was

Hole-transport luminescent layer: 400 to 500 Å;

TAZ layer: 200 Å; and

Alq layer: 300 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element of the layer structure shown in FIG. 6(a). The deposition rate for the electrode layer and that of the protective layer were 11 Å/sec. and 10 Å/sec., respectively.

The ITO film and the Mg/Ag electrode layer thus prepared were employed as an anode and a cathode, respectively, and a bias voltage was applied between a couple of electrodes at room temperature in air to allow the luminescent layer to emit light. Its luminance was measured using the aforesaid luminance meter.

There observed white light emission of 3352 cd/m$^2$ in luminance at a drive voltage of 16 V and a current density of 250 mA/cm$^2$.

Figure 13:
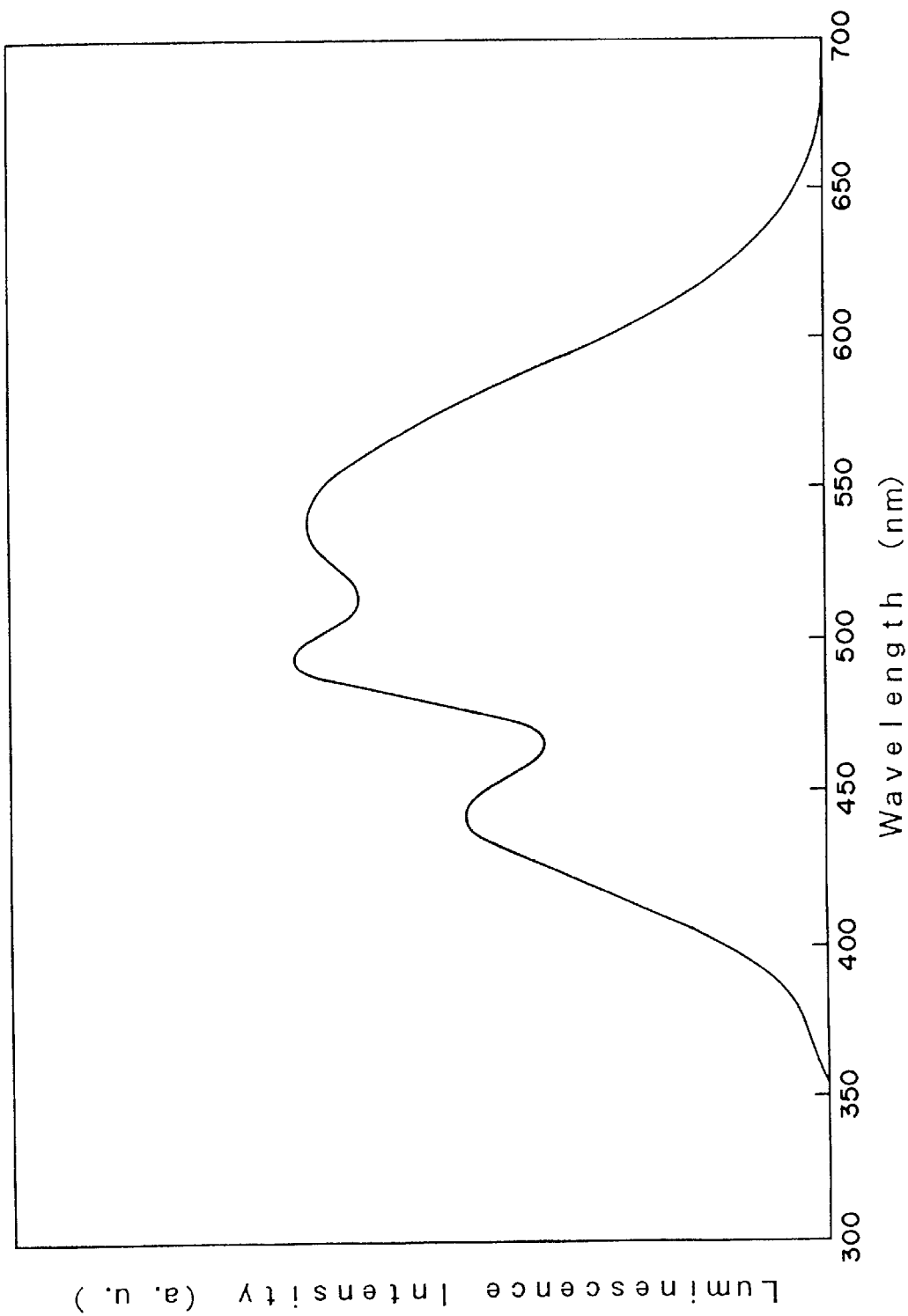
FIG. 13 is a graph illustrating the measurement results of an emission spectrum of the third organic electroluminescent element prepared in Example 9.

Further, the white light emission was measured at room temperature using the aforesaid fluorophotometer. There obtained an emission spectrum that extended over a range of visible light having a wavelength of 400–700 nm, as shown in FIG. 13.

Still further, even if the element was preserved at room temperature for several days, there observed no change in appearance, and the element emitted light at luminance similar to that before preservation.

Example 10

In the same manner as in Example 9 except that an application solution was prepared by dissolving the PVK and 5 molar % (for PVK) of the TPB in dichloromethane, an organic electroluminescent element was prepared and its characteristics were examined.

There observed blue light emission with a luminance of 1500 cd/m$^2$ at a drive voltage of 16 V and a current density of 220 mA/cm$^2$.

Figure 14:
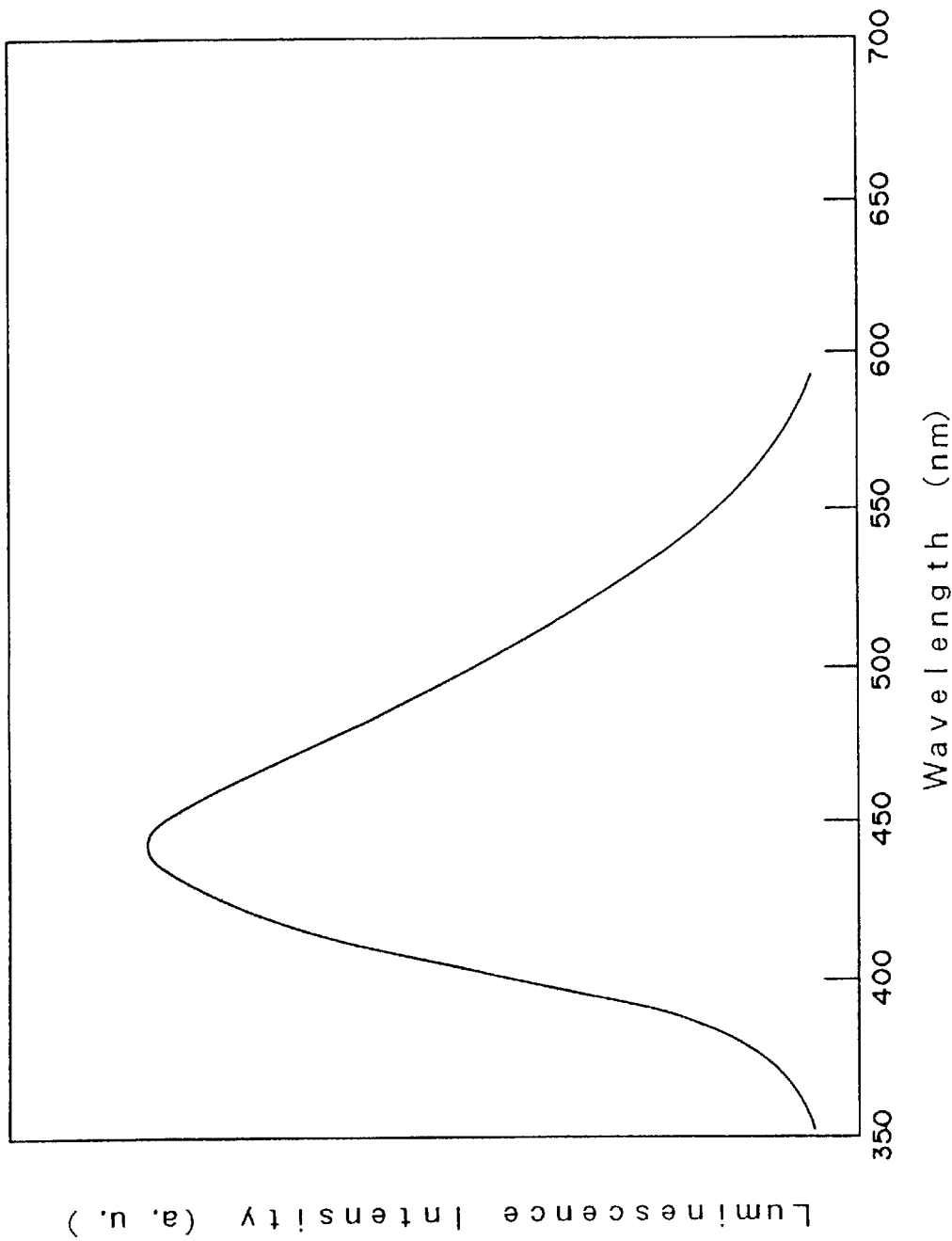
FIG. 14 is a graph illustrating the measurement results of an emission spectrum of the third organic electroluminescent element prepared in Example 10.

Further, the blue light emission was measured using the aforesaid fluorophotometer. There obtained an emission spectrum having a peak at a wavelength of 450 nm, as shown in FIG. 14. This proved that blue light emission originated from the TPB.

Still further, even if the element was preserved at room temperature for several days, there observed no change in appearance, and the element emitted light at luminance similar to that before preservation.

Example 11

In the same manner as in Example 9 except that an application solution was prepared by dissolving the PVK and 1 molar % (for PVK) of the coumarine 6 in dichloromethane, an organic electroluminescent element was prepared and its characteristics was examined.

There observed green light emission with a luminance of 2200 cd/m$^2$ at a drive voltage of 16 V and a current density of 340 mA/cm$^2$.

Figure 15:
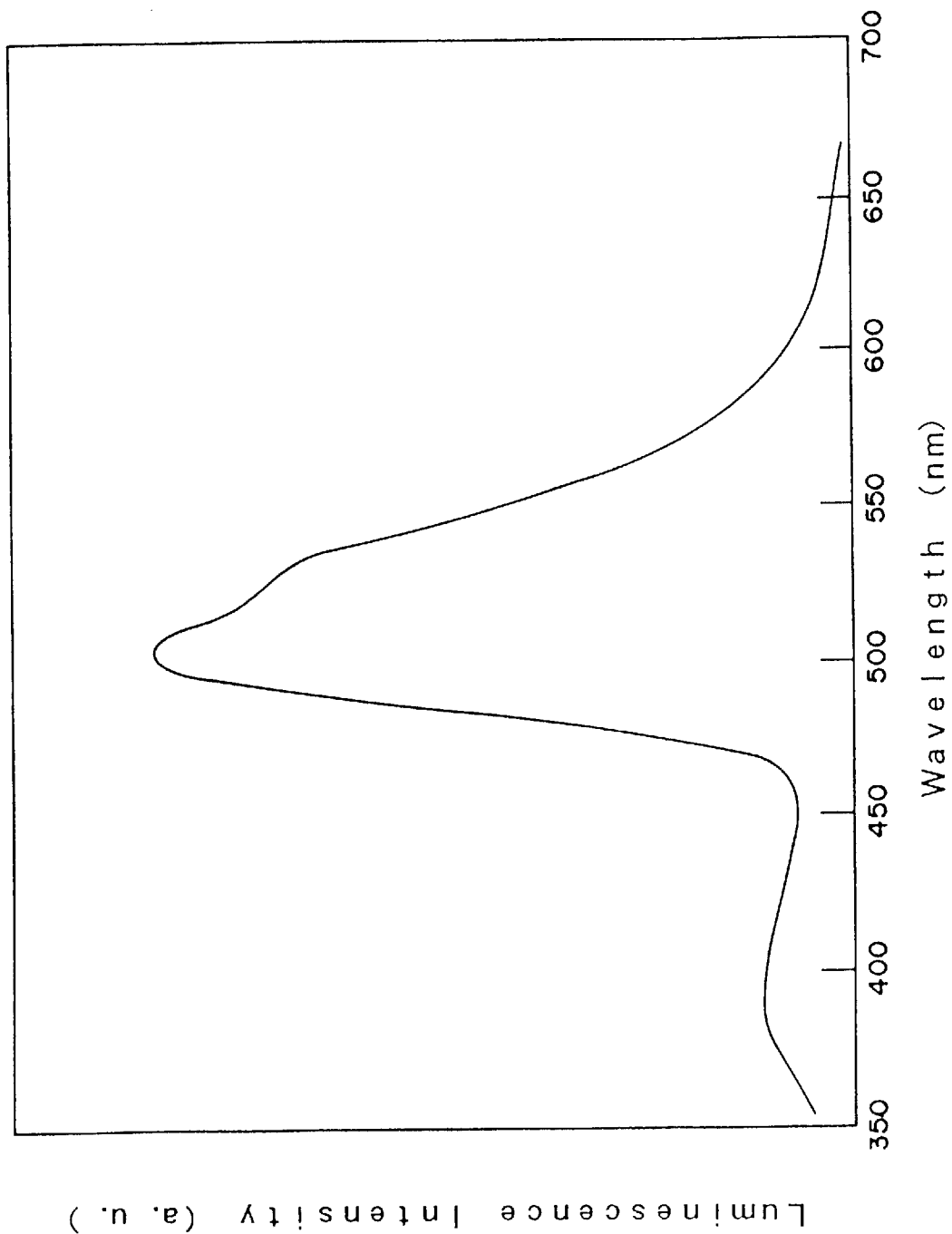
FIG. 15 is a graph illustrating the measurement results of an emission spectrum of the third organic electroluminescent element prepared in Example 11.
Figure 16:
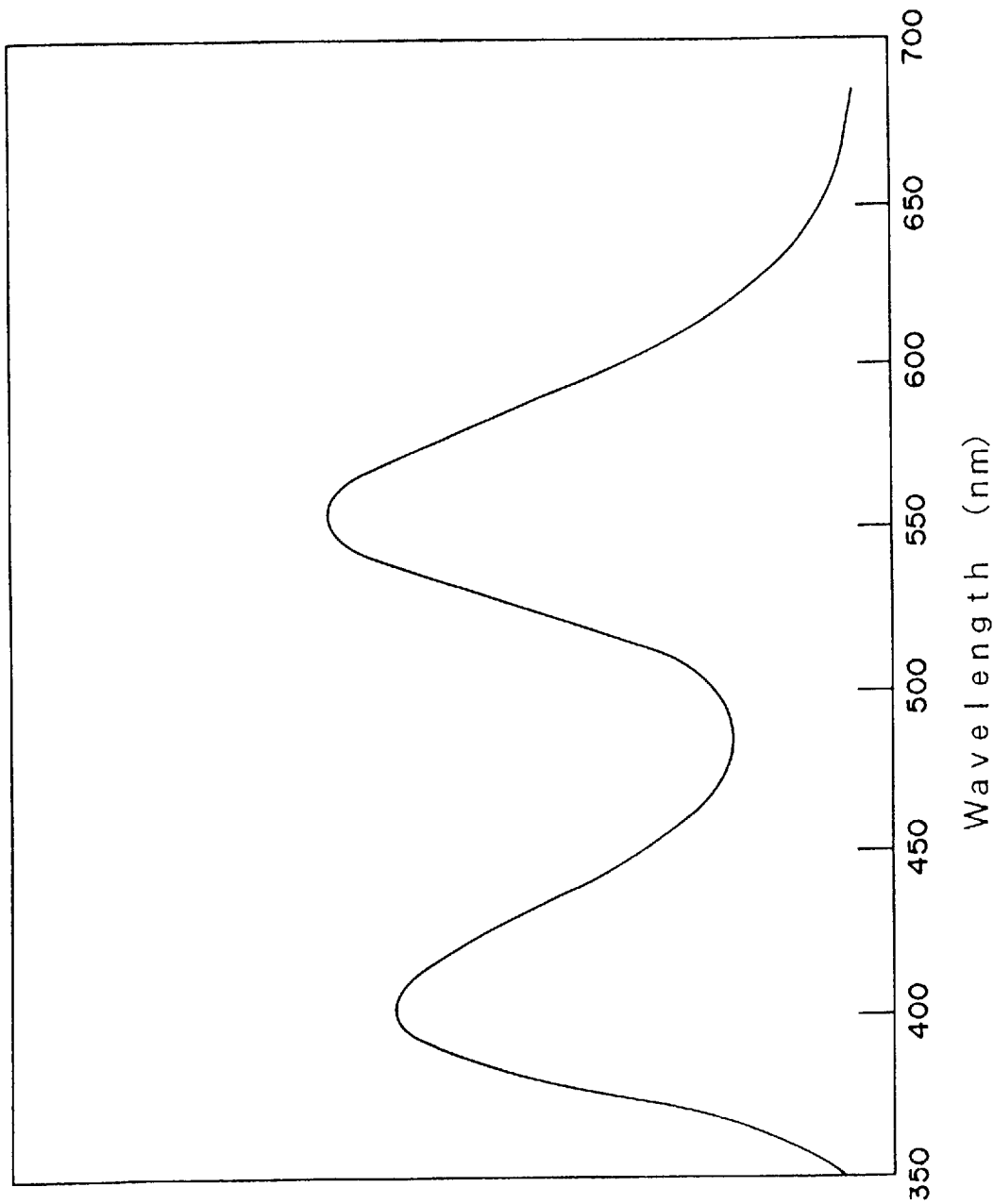
FIG. 16 is a graph illustrating the measurement results of an emission spectrum of the third organic electroluminescent element prepared in Example 12.

Further, the green light emission was measured using the aforesaid fluorophoto meter. There obtained an emission spectrum having a peak at a wavelength of 510 nm, as shown in FIG. 15. This proved that green light emission originated from the coumarine 6.

Still further, even if the element was preserved at room temperature for several days, there observed no change in appearance, and the element emitted light at luminance similar to that before preservation.

Example 12

In the same manner as in Example 9 except that an application solution was prepared by dissolving the PVK and 0.1 molar % (for PVK) of the DCM in dichloromethane, an organic electroluminescent element was prepared and its characteristics was examined.

There observed white light emission with a luminance of 1100 cd/m$^2$ at a drive voltage of 16 V and a current density of 210 mA/cm$^2$.

Further, the white light emission was measured using the aforesaid fluorophotometer. As a result, it was confirmed that the white light emission originated from the light emission of the PVK whose wavelength is 410 nm and light emission of the DCM whose wavelength is 550 nm.

Thereafter, in the same manner in the foregoing except that the DCM concentration for the PVK was changed to 2 molar %, an organic electroluminescent element was prepared and its characteristics was examined.

There observed that a peak value at a wavelength of 550 nm became larger than that in at a wavelength of 410 nm, resulting in orange light emission.

Still further, even if the elements were preserved at room temperature for several days, there observed no change in appearance, and the element emitted light at luminance similar to that before preservation.

Example 13

On an ITO (indium-tin-oxide) coated glass substrate having a sheet resistance of 15 Ω/□ (ITO film thickness: 1500 to 1600 Å, manufactured by Asahi Glass Co., Ltd.), the PTAZ-1 expressed by the formula (6a) as a hole-transport material was coated by dip coating using dichloromethane as a solvent to form a PTAZ-1 layer. Then, the Alq expressed by the formula (3) as an electron-transport material was applied vacuum deposition the PTAZ-1 layer to form a Alq layer. The luminescent region was represented by a square being 0.5 cm in side.

The deposition conditions were
  Ultimate vacuum degree: 1 to 2×10$^{-5}$ Torr;
  Temperature substrate: Room temperature; and
  Deposition rate: 2 to 4 Å/sec.
Each film thickness was
  PTAZ-1 layer (a hole-transport layer): 400 Å; and
  Alq layer (an electron-transport layer): 600 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element. The deposition rate for the electrode layer and the protective layer were 11 Å/sec. and 10 Å/sec., respectively.

The ITO film and the Mg/Ag electrode layer thus prepared were used as an anode and a cathode, respectively, and a bias voltage was applied between a couple of electrodes at room temperature in air to allow the luminescent layer to emit light. Its luminance was measured using the aforesaid luminance meter. There obtained light emission of 1200 cd/m$^2$ in luminance at a drive voltage of a maximum 16 V (180 mA/cm$^2$).

Still further, even if the element was preserved at room temperature for several days, there observed no change in appearance, and the element emitted light at luminance similar to that before preservation.

Example 14

In the same manner as in Example 13 except that the PTAZ-2 expressed by the formula (6b) as a material of constituting a hole-transport layer was used in place of the PTAZ-1, an organic electroluminescent was prepared and its luminance was measured.

There observed light emission of 370 cd/m$^2$ in luminance at a drive voltage of a maximum 16 V (730 mA/cm$^2$).

Further, even if the element was preserved at room temperature for several days, there observed no change in appearance, and the element emitted light at luminance similar to that before preservation.

Example 15

On an ITO (indium-tin-oxide) coated glass substrate having a sheet resistance of 15 Ω/□ (ITO film thickness: 1500 to 1600 Å, manufactured by Asahi Glass Co., Ltd.,), a PTAZ-2 wherein 30% by weight of the TPD expressed by the formula (5), as a hole-transport material, was molecularly dispersed was coated by dip coating using dichloromethane as a solvent to form a PTAZ-2:TPD layer, on which the Alq was deposited by vacuum deposition to form an Alq layer. Its luminescent region was represented by a square being 0.5 cm in side. The deposition conditions were the same as in Example 13. Each film thickness was:
  PTAZ-2:TPD layer (a hole-transport layer): 400 Å; and
  Alq layer (an electron-transport layer): 800 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element. The deposition rates for the electrode layer and the protective layer were the same as in Example 13.

The ITO film and the Mg/Ag electrode layer thus prepared were used as an anode and a cathode, respectively, and a bias voltage was applied between a couple of electrodes at room temperature in air to allow the luminescent layer to emit light. Its luminance was measured using the aforesaid luminance meter.

There observed light emission of 4500 cd/m² in luminance at a drive voltage of a maximum 14 V (250 mA/cm²).

Further, even if the element was preserved at room temperature for several days, there observed no change in appearance, and the element emitted light at luminance similar to that before preservation.

Comparative Example 3

In the same manner as in Example 15 except that a hole-transport layer composed of the TPD alone was formed by vacuum deposition in place of the PTAZ-2:TPD layer, an organic electroluminescent element was prepared [a TPD layer (a hole-transport layer): 500 Å, an Alq layer (an electron-transport layer): 500 Å], and its luminance was measured in the aforesaid manner.

There observed light emission of 10000 cd/m² in high luminance at a drive voltage of 14 V.

Further, the element was preserved at room temperature for several days. As a result, it was confirmed that black points occurred on the luminescent surface and that the TPD was crystallized.

Example 16

On an ITO (indium-tin-oxide) coated glass substrate having a sheet resistance of 15 Ω/□ (ITO film thickness: 1500 to 1600 Å, manufactured by Asahi Glass Co., Ltd.,), a PTAZ-2 wherein 30% by weight of the TPD was molecularly dispersed was coated by dip coating using dichloromethane as a solvent to form a PTAZ-2:TPD layer, on which a 2,5-bis(5-tertbutyl-2-benzooxazolyl)-thiophene (hereinafter referred to as "BBOT") expressed by the formula:

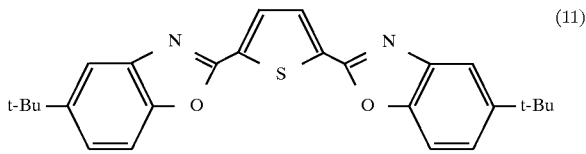

(11)

as a luminescent material and the TAZ expressed by the formula (1) as an electron-transport material were deposited in this order by vacuum deposition method to form a BBOT layer and a TAZ layer. The luminescent region was represented by a square being 0.5 cm in side. The deposition conditions were the same as in Example 13. Each film thickness was:

PTAZ-2:TPD layer (a hole-transport layer): 400Å;
BBOT layer (a luminescent layer): 700 Å; and
TAZ layer (an electron-transport layer): 400 Å.

Then, on the Alq layer, magnesium was codeposited with silver to form a Mg/Ag electrode layer having a film thickness of 2000 Å [Mg/Ag=10/1 (molar ratio)], on which silver was deposited alone to form a protective layer having a film thickness of 1000 Å, thus obtaining an organic electroluminescent element. The deposition rates for the electrode layer and protective layer were the same as in Example 13.

The ITO film and the Mg/Ag electrode layer of the organic electroluminescence thus prepared were used as an anode and a cathode, respectively, and a bias voltage was applied between a couple of electrodes at room temperature in air. As a result, blue light emission with good efficiency was obtained.

The luminance was measured in the same manner as in Examples 13 to 15. There observed light emission of 100 cd/m² in luminance at a drive voltage of a maximum 18 V (8 mA/cm²), as shown in FIG. 17 (wherein a plot o-o denotes the relation between an applied voltage and luminance, and another plot Δ-Δ denotes the relation between an applied voltage and a current density).

Further, the light emission was measured at room temperature using the aforesaid fluorophotometer. There obtained an emission spectrum having a peak at a wavelength of 443 nm, as shown in FIG. 18. The emission spectrum corresponded to that of the BBOT. This proved that light emission originated from the BBOT layer of Example 16.

Comparative Example 4

In the same manner as in Example 16 except that a hole-transport layer composed of the TPD alone was prepared by vacuum deposition in place of the PTAZ-2:TPD layer, thus obtaining an organic electroluminescent element comprising a TPD layer (a hole-transport layer): 400 Å; a BBOT layer (a luminescent layer): 700 Å and a TAZ layer (an electron-transport layer): 400 Å. This element, however, emitted light with poor luminance efficiency.

I claim:

1. An organic electroluminescent element comprising an anode, a cathode and an organic layer interposed therebetween and said organic layer comprises (i) a carrier-transport control layer consisting of [a 3-(4-biphenylyl)-4,5-diphenyl-1,2,4-triazole derivative]3-(4-biphenylyl)-4-phenyl-5-(4-tert-butylphenyl)-1,2,4-triazole expressed by the formula:

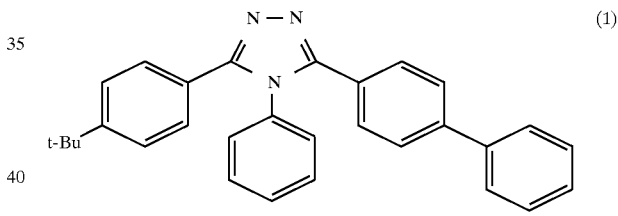

(1)

exhibiting electron-transport properties and hole blocking properties and (ii) at least a hole-transport layer interposed between the carrier-transport control layer and the anode.

2. An organic electroluminescent element according to claim 1, wherein said hole-transport layer emits a blue light, and is a layer of poly-N-vinylcarbazole, expressed by the formula:

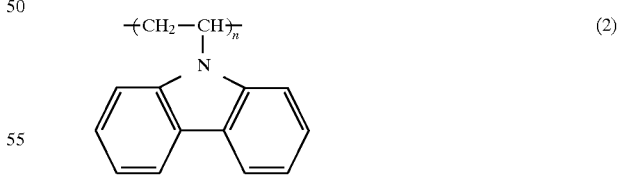

(2)

wherein n denotes a polymerization degree.

3. An organic electroluminescent element according to claim 1, wherein said hole-transport layer emits a blue light.

4. An organic electroluminescent element comprising an anode, a cathode and an organic layer interposed therebetween wherein said organic layer comprises (i) a carrier-transport control layer consisting of [a 3-(4-biphenylyl)-4,5-diphenyl-1,2,4-triazole derivative]3-(4-biphenylyl)-4-phenyl-5-(4-tert-butylphenyl)-1,2,4-triazole expressed by the formula:

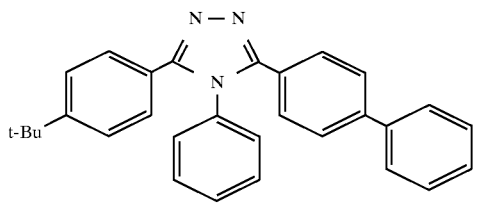

exhibiting electron-transport properties and hole blocking properties, (ii) a hole transport layer interposed between the carrier-transport control layer and the anode and (iii) an electron-transport layer interposed between the cathode and the carrier-transport control layer, wherein said electron-transport layer is a layer of a tris(8-quinolinolato)aluminum (III) complex of the formula:

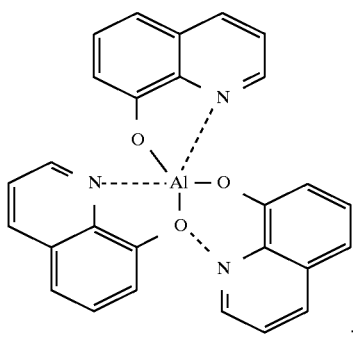

5. An organic electrolumiscent element according to claim 4, wherein said hole-transport layer emits a blue light, and is a layer of poly-N-vinylcarbazole, expressed by the formula:

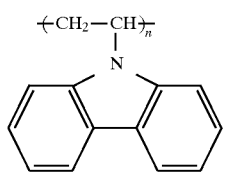

wherein n denotes a polymerization degree.

6. An organic electroluminescent element comprising an anode, a cathode and an organic layer interposed therebetween wherein said organic layer comprises a carrier-transport control layer which does not itself emit light comprising [a 3-(4-biphenylyl)-4,5-diphenyl-1,2,4-triazole derivative]3-(4-biphenylyl)-4-phenyl-5-(4-tert-butylphenyl)-1,2,4-triazole expressed by the formula:

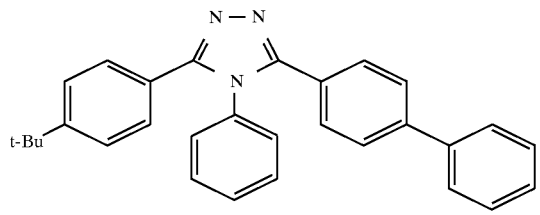

having a function either of:
  a) allowing electrons injected from the cathode to pass toward the anode while blocking holes injected from the anode to prevent the holes from passing toward the cathode; or
  b) allowing holes injected from the anode to pass toward the cathode and electrons injected from the cathode to pass toward the anode, a hole transport layer interposed between the carrier-transport control layer and the anode, and
an electron-transport layer interposed between the carrier transport control layer and the cathode, and in accordance with the function of the carrier-transport control layer
  a) the hole transport layer, or
  b) both the hole-transport layer and the electron-transport layer emit light.

7. An organic electroluminescent element according to claim 6, wherein the hole-transport layer is a layer of N,N'-diphenyl-N,N'-bis(3-methylphenyl)-1,1'-biphenyl-4,4'-diamine expressed by the formula:

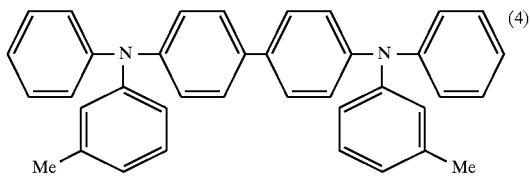

and the electron transport layer is a layer of a tris(8-quinolinolato)aluminum (III) complex of the formula:

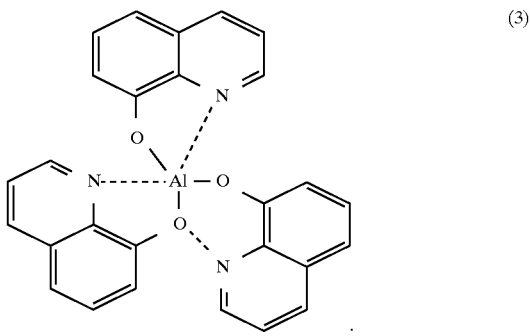

8. An organic electroluminescent element according to claim 6, wherein said hole-transport layer emits light when the thickness of said carrier-transport control layer is not less than 150 Å.

9. An organic electroluminescent element according to claim 6, wherein both said electron-transport layer and said hole-transport layer emit light when the thickness of said carrier-transport control layer exceeds 50 Å and is less than 150 Å.

10. An organic electroluminescent element comprising an anode, a cathode and an organic layer interposed therebetween wherein said organic layer comprises (i) an electron-transport layer comprising 3-(4-biphenylyl)-4-phenyl-5-(4-tert-butylphenyl)-1,2,4-triazole expressed by the formula:

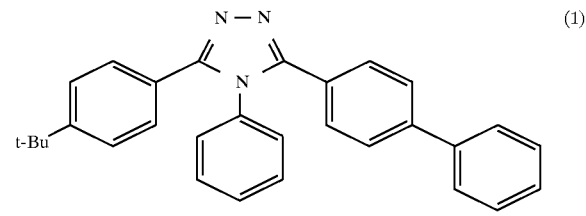

and (ii) a hole transport luminescent layer interposed between the electron-transport layer and the anode wherein said hole transport luminescent layer comprises a polymer having carrier-transport properties and at least one dye which is molecularly dispersed in the polymer.

11. An organic electroluminescent element according to claim 10, wherein the electron-transport layer is composed of a single layer of [a 3-(4-biphenylyl)-4,5-diphenyl-1,2,4-triazole derivative]3-(4-biphenylyl)-4-phenyl-5-(4-tert-butylphenyl)-1,2,4-triazole expressed by the formula:

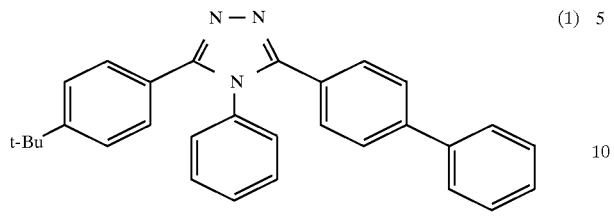
(1)

exhibiting electron-transport properties and hole blocking properties, or two layers consisting of the layer of said [3-(4-biphenylyl)-4,5-diphenyl-1,2,4-triazole derivative]3-(4-biphenylyl)-4-phenyl-5-(4-tert-butylphenyl)-1,2,4-triazole and a layer of a tris(8-quinolinolato)aluminum (III) complex expressed by the formula:

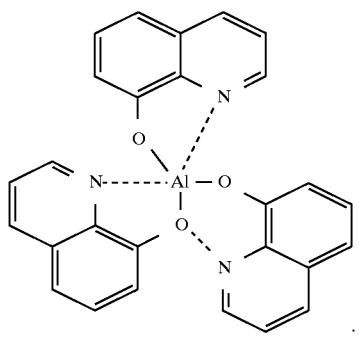
(3)

12. An organic electroluminescent element according to claim 10, wherein the polymer having carrier-transport properties is a poly-N-vinylcarbazole expressed by the formula:

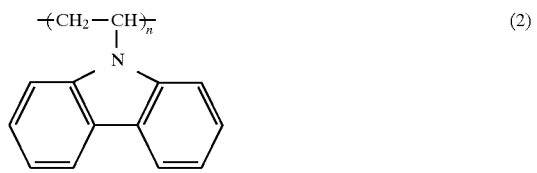
(2)

wherein n denotes a polymerization degree.

13. An organic electroluminescent element according to claim 10, wherein a plurality of dyes that are molecularly dispersed in the hole-transport luminescent layer, are combined such that an emission spectrum of the hole-transport luminescent layer extends over the whole range of visible light region having a wavelength of 400 to 700 nm.

14. An organic electroluminescent element according to claim 13, wherein the combined dyes are tetraphenylbutadiene expressed by the formula:

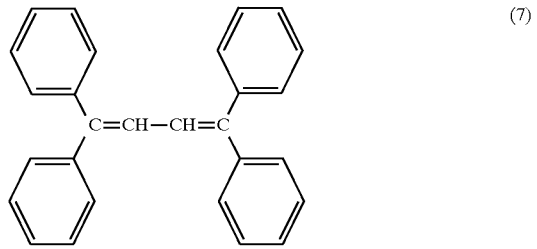
(7)

a coumarine 6 expressed by the formula:

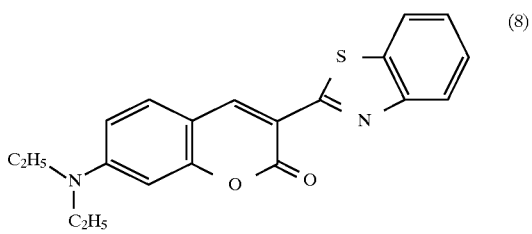
(8)

and a 4-dicyanomethylene-2-methyl-6-p-dimethylaminostyryl-4H-pyran expressed by the formula:

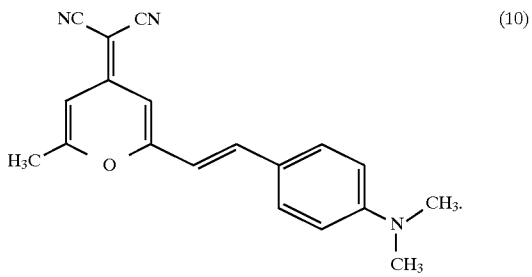
(10)

15. An organic electroluminescent element comprising an anode, a cathode and an organic layer interposed therebetween wherein said organic layer comprises (i) an electron-transport layer comprising 3-(4-biphenylyl)-4-phenyl-5-(4-tert-butylphenyl)-1,2,4-triazole expressed by the formula:

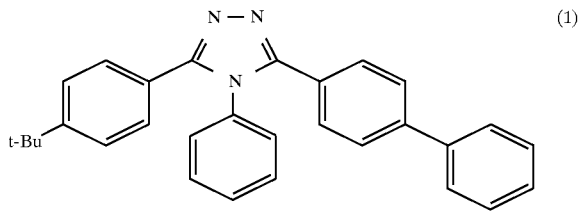
(1)

and (ii) a hole-transport luminescent layer interposed between the electron-transport layer and the anode and wherein said hole-transport luminescent layer comprises a polymer having no carrier-transport properties and at least one dye and a hole-transport material which are molecularly dispersed in the polymer, and said hole-transport material transports holes injected from said anode to said dye and the dye is excited by excitons generated by recombination of said holes and electrons injected from said electron-transport layer into said hole-transport luminescent layer, to emit light.

16. An organic electroluminescent element according to claim 15, wherein the hole-transport material is N,N'-diphenyl-N,N'-bis(3-methylphenyl)-1,1'-biphenyl-4,4'-diamine expressed by the formula:

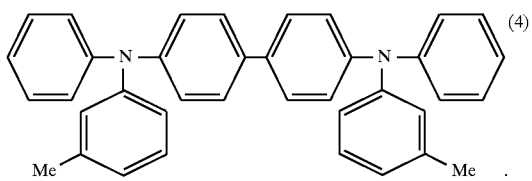
(4)

17. An organic electroluminescent element according to claim 15, wherein the electron-transport layer is composed of a single layer of [a 4-(4-biphenyl)-4,5-diphenyl-1,2,4-triazole derivative]3-(4-biphenylyl)-4-phenyl-5-(4-tert-butylphenyl)-1,2,4-triazole expressed by the formula:

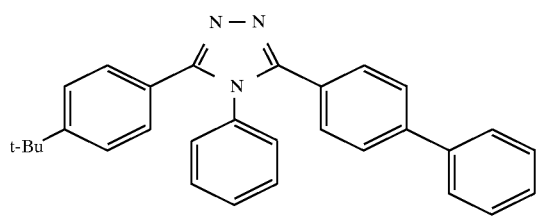
(1)

exhibiting electron-transport properties and hole blocking properties, or two layers consisting of the layer of said [4-(4-biphenyl)-4,5-diphenyl-1,2,4-triazole derivative]3-(4-biphenylyl)-4-phenyl-5-(4-tert-butylphenyl)-1,2,4-triazole and a layer of a tris(8-quinolinolato)aluminum (III) complex expressed by the formula:

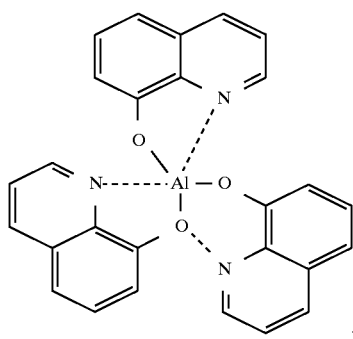
(3)

18. An organic electroluminescent element according to claim 15, wherein a plurality of dyes that are molecularly dispersed in the hole-transport luminescent layer, are combined such that an emission spectrum of the hole-transport luminescent layer extends over the whole range of visible light region having a wavelength of 400 to 700 nm.

19. An organic electroluminescent element according to claim 18, wherein combined dyes are tetraphenylbutadiene expressed by the formula:

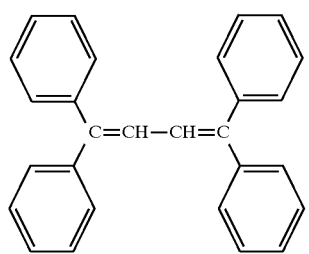
(7)

a coumarine 6 expressed by the formula:

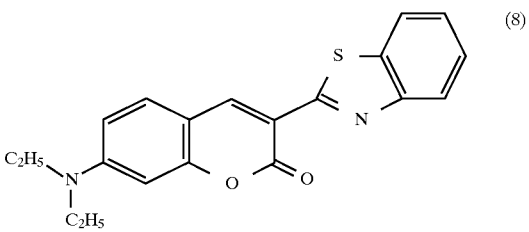
(8)

and a 4-dicyanomethylene-2-methyl-6-p-dimethylaminostyryl-4H-pyran expressed by the formula:

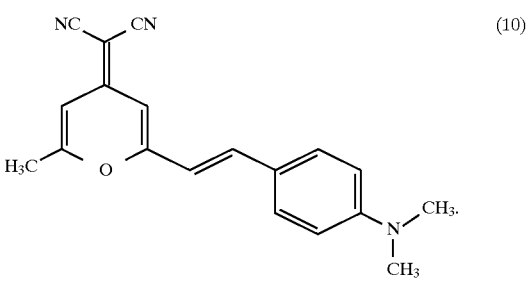
(10)

20. An organic electroluminescent element comprising an anode, a cathode and an organic layer interposed therebetween and said organic layer comprises a hole-transport layer which contains, as a hole-transport material, a high-molecular 1,2,4-triazole derivative expressed by the general formula:

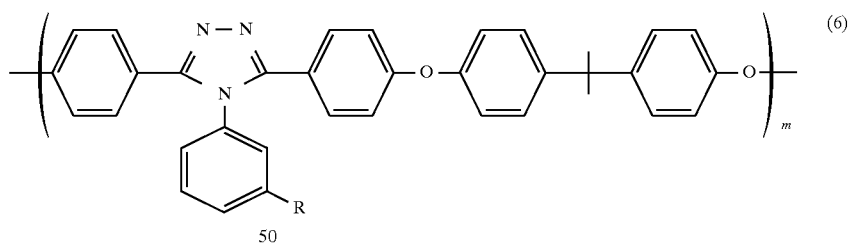
(6)

wherein R denotes at least one member selected from the group consisting of: a hydrogen atom, a methyl group and an ethyl group, m denotes a polymerization degree and is in the range of 3000 to 30000.

21. An organic electroluminescent element comprising an anode, a cathode and an organic layer interposed therebetween and said organic layer comprises a hole-transport layer which is formed by molecularly dispersing a hole-transport material in a high-molecular 1,2,4-triazole derivative expressed by the general formula:

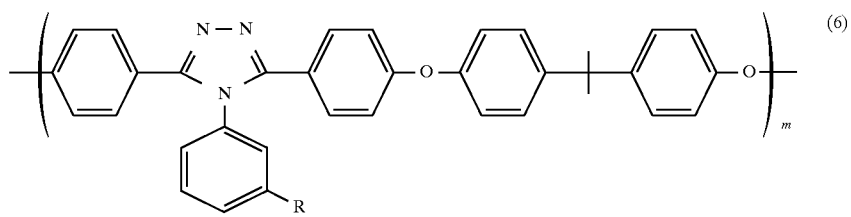

wherein R denotes at least one member selected from the group consisting of: a hydrogen atom, a methyl group and an ethyl group, m denotes a polymerization degree and is in the range of 3000 to 30000 as a resin binder.

22. An organic electroluminescent element according to claim 21, wherein the hole-transport material is a N,N'-diphenyl-N,N'-bis(3-methylphenyl)-1,1'-biphenyl-4,4'-diamine expressed by the formula:

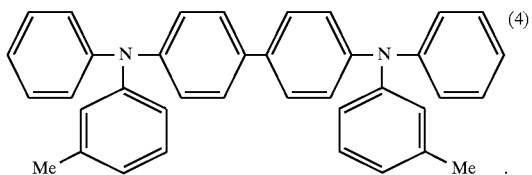

* * * * *